(12) United States Patent
Chang et al.

(10) Patent No.: US 9,639,652 B2
(45) Date of Patent: *May 2, 2017

(54) COMPACT MODEL FOR DEVICE/CIRCUIT/CHIP LEAKAGE CURRENT (IDDQ) CALCULATION INCLUDING PROCESS INDUCED UPLIFT FACTORS

(71) Applicant: GLOBALFOUNDRIES INC., Grand Cayman (KY)

(72) Inventors: Paul Chang, Mahopac, NY (US); Jie Deng, Poughkeepsie, NY (US); Terrence B. Hook, Jericho, VT (US); Sim Y. Loo, Rochester, MN (US); Anda C. Mocuta, LaGrangeville, NY (US); Jae-Eun Park, Wappingers Falls, NY (US); Kern Rim, Yorktown Heights, NY (US); Xiaojun Yu, Sunnyvale, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 296 days.

This patent is subject to a terminal disclaimer.

(21) Appl. No.: 14/148,234

(22) Filed: Jan. 6, 2014

(65) Prior Publication Data

US 2014/0123097 A1    May 1, 2014

Related U.S. Application Data

(63) Continuation of application No. 12/574,440, filed on Oct. 6, 2009, now Pat. No. 8,626,480.

(51) Int. Cl.
  *G06F 17/50*  (2006.01)
  *G01R 31/28*  (2006.01)
  *G01R 31/30*  (2006.01)

(52) U.S. Cl.
  CPC ...... *G06F 17/5081* (2013.01); *G01R 31/2848* (2013.01); *G06F 17/5009* (2013.01); *G06F 17/5022* (2013.01); *G06F 17/5036* (2013.01); *G01R 31/3008* (2013.01)
  (Continued)

(58) Field of Classification Search
  CPC ............. G06F 17/5081; G06F 17/5009; G06F 17/5036; G06F 17/5022; G01R 31/2848
  (Continued)

(56) References Cited

U.S. PATENT DOCUMENTS 5,128,507 A    7/1992  Drake
5,692,160 A    11/1997 Sarin
(Continued)

OTHER PUBLICATIONS

Hook et al., "Estimation of Iddq for Early Chip and Technology Design Decisions", IEEE 2003 Customer Integrated Circuits Conference, pp. 627-630.
(Continued)

*Primary Examiner* — Eunhee Kim
(74) *Attorney, Agent, or Firm* — Scully Scott Murphy and Presser

(57) ABSTRACT

A system, method and computer program product for implementing a quiescent current leakage specific model into semiconductor device design and circuit design flows. The leakage model covers all device geometries with wide temperature and voltage ranges and, without the need for stacking factor calculations nor spread sheet based IDDQ calculations. The leakage model for IDDQ calculation incorporates further parasitic and proximity effects. The leakage model implements leakage calculations at different levels of testing, e.g., from a single device to a full chip design, and are integrated within one single model. The leakage model implements leakage calculations at different levels of testing with the leverage of a single switch setting. The implementation is via a hardware definition language code or object oriented code that can be compiled and operated using a
(Continued)

netlist of interest, e.g., for conducting a performance analysis.

26 Claims, 8 Drawing Sheets

(58) Field of Classification Search
USPC .................................. 703/13, 14; 716/136
See application file for complete search history.

(56) References Cited

U.S. PATENT DOCUMENTS

| | | |
|---|---|---|
| 5,838,947 A | 11/1998 | Sarin |
| 6,493,856 B2 | 12/2002 | Usami et al. |
| 6,515,500 B1 | 2/2003 | Okuda |
| 6,842,714 B1 | 1/2005 | Acar et al. |
| 7,137,080 B2 | 11/2006 | Acar et al. |
| 7,820,457 B2 | 10/2010 | Chen et al. |
| 2002/0116440 A1 | 8/2002 | Cohn et al. |

OTHER PUBLICATIONS

Agarwal et al., "Accurate Estimation and Modeling of Total Chip Leakage Considering Inter- & Intra-Die Process Variations", 2005 IEEE, pp. 735-741.

Mukhopadhyay et al., "Accurate Estimation of Total Leakage Current in Scaled CMOS Logic Circuits Based on Compact Current Modeling", DAC, Jun. 2-6, 2003, pp. 169-174.

Rao et al., "Statistical Estimation of Leakage Current Considering Inter- and Itra-Die Process Variation", ISLPED, Aug. 25-27, 2003, pp. 84-89.

COMPACT MODEL FOR DEVICE/CIRCUIT/CHIP LEAKAGE CURRENT (IDDQ) CALCULATION INCLUDING PROCESS INDUCED UPLIFT FACTORS

CROSS REFERENCE TO RELATED APPLICATION

This application is a continuation of U.S. patent application Ser. No. 12/574,440, filed Oct. 6, 2009 the entire content and disclosure of which is incorporated herein by reference.

BACKGROUND

Leakage assessment has become very crucial part of circuit design, both in portable low-power applications where leakage current can limit the interval between battery recharges, and also high-power applications where the leakage current can be a substantial portion of the total power dissipation of the operating unit. Current look-up table and general-purpose circuit simulation program (e.g., SPICE) model approaches offer limited benefit at best and the scope of coverage is very limited as well. For example, current SPICE models and circuit simulation programs are not generally focused on calculating quiescent current (often called IDDQ).

It would be highly desirable to provide an improved solution for circuit simulators to implement IDDQ leakage-specific models into the current design flows.

Furthermore, it is desirable to provide an improved solution for circuit simulators to implement IDDQ leakage specific models into the current design flows wherein the leakage model covers all geometries with wide temperature and voltage ranges without tedious stacking factor calculations nor spread sheet based IDDQ calculation.

Further more, in such a solution, it is desirable to provide an improved solution for circuit simulators to implement leakage specific models into the current design flows wherein the leakage model allows all parasitic and proximity effects to be incorporated for IDDQ calculation.

SUMMARY

There is provided a system and method for circuit simulators (e.g., SPICE) to model the IDDQ quiescent current state when conducting performance analysis of integrated circuit designs, and particularly, implementing leakage specific models into the design flows wherein the leakage model covers all geometries with wide temperature and voltage ranges without tedious stacking factor calculations nor spread sheet based Iddq calculation. The leakage model further allows all parasitic and proximity effects to be incorporated into the design flow for Iddq calculation.

Since they can be compiled and operated using a netlist of interest for the performance analysis, the leakage specific models implemented into the design flows provides a novel solution for leakage assessment.

More particularly, there is provided a system and method for simulating an integrated circuit (IC) design in a circuit design simulator, the method comprising: receiving data representing a circuit design, the data configured for input to and processing by the circuit design simulator, the data specifying an uplift switch value for an integrated circuit quiescent current (IDDQ) prediction macro, the switch value corresponding to one of: the device, cell, circuit, or IC chip level of design being simulated; when simulating the circuit, using the IDDQ prediction macro to model a leakage current prediction for the circuit design, the leakage current prediction determinable at a device, cell, circuit, or IC chip level of the design, automatically calculating one or more uplift factors representing device variation effects for use in the leakage current prediction model according to the switch value, an uplift factor being a function of a statistical quantity $\sigma_{lpoly}$ of the polysilicon gate length variation of a transistor, a statistical quantity $\sigma_{vtsat}$ of the transistor saturation threshold voltage variation, and a statistical quantity $\sigma_{subx}$ of the transistor sub threshold slope, wherein for a specified uplift factor switch value, $\sigma_{lpoly} = \sigma_{ACLV}$; $\sigma_{vtsat}$ is calculated as a function of a statistical quantity $\sigma_{VthRDF}$ defining a 1-sigma Random-Dopant-Fluctuation Induced Vth Variation, and $\sigma_{subx}$ is calculated as a function of a statistical quantity $\sigma_{subVth}$ defining a 1-sigma subVth Slope Variation, where Vth is the threshold voltage of the transistor device, and $\sigma_{ACLV}$ is a 1-sigma Across-Chip Lpoly Length Variation value due to within chip Across-Chip-Length-Variation, wherein a processor device performs at least one of the receiving, using, modeling and uplift factor calculating.

Further to this embodiment, the statistical modeling includes obtaining data used to predict current leakage resulting from proximity effects inherent in the circuit design.

Further to this embodiment, the statistical modeling includes obtaining data used to predict current leakage as a function of device variations effects, the uplift factor calculated based on the device variations effects.

According to a further aspect, there is provided a system for simulating current leakage of a semiconductor device design comprising: a memory; a processor in communications with the memory, wherein the computer system is capable of performing a method comprising: receiving data representing a circuit design, the data configured for input to and processing by the circuit design simulator, the data specifying an uplift switch value for an integrated circuit quiescent current (IDDQ) prediction macro, the switch value corresponding to one of: the device, cell, circuit, or IC chip level of design being simulated; when simulating the circuit, using the IDDQ prediction macro to model a leakage current prediction for the circuit design, the leakage current prediction determinable at a device, cell, circuit, or IC chip level of the design, automatically calculating one or more uplift factors representing device variation effects for use in the leakage current prediction model according to the switch value, an uplift factor being a function of a statistical quantity $\sigma_{lpoly}$ of the polysilicon gate length variation of a transistor, a statistical quantity $\sigma_{vtsat}$ of the transistor saturation threshold voltage variation, and a statistical quantity $\sigma_{subx}$ of the transistor sub-threshold slope, wherein for a specified uplift factor switch value, $\sigma_{lpoly} = \sigma_{ACLV}$; $\sigma_{vtsat}$ is calculated as a function of a statistical quantity $\sigma_{VthRDF}$ defining a 1-sigma Random-Dopant-Fluctuation Induced Vth Variation, and $\sigma_{subx}$ is calculated as a function of a statistical quantity $\sigma_{subVth}$ defining a 1-sigma subVth Slope Variation, where Vth is the threshold voltage of the transistor device, and $\sigma_{ACLV}$ is a 1-sigma Across-Chip Lpoly Length Variation value due to within chip Across-Chip-Length-Variation, wherein a processor device performs at least one of the receiving, using, modeling and uplift factor calculating.

Moreover, the invention provides a computer program product having instructions for simulating current leakage of a semiconductor device design.

Advantageously, the system and method of the invention implements leakage specific models into the design flows for 45 nm node technologies and beyond.

BRIEF DESCRIPTION OF THE DRAWINGS

The objects, features and advantages of the present invention will become apparent to one of ordinary skill in the art, in view of the following detailed description taken in combination with the attached drawings, in which.

DETAILED DESCRIPTION

The present invention enables the implementation of leakage specific models into current semiconductor device design and circuit design flows. In one embodiment, the implementation is via a hardware definition language (e.g., Verilog) code or object oriented code (e.g., C++) that can be compiled and operated using a netlist of interest, e.g., for conducting a performance analysis. This approach thus offers a novel solution for IDDQ current leakage assessment.

In one embodiment, the leakage model covers all geometries with wide temperature and voltage ranges and, without the need for stacking factor calculations nor spread sheet based IDDQ calculations. The leakage model for IDDQ calculation may incorporate further parasitic and proximity effects (i.e., effects due to impact of the device environment that is layout-dependent). The leakage model implements leakage calculations at different levels of testing, e.g., from a single device to a full chip design, and are integrated within one single model. The leakage model can implement leakage calculations at different levels of testing with the leverage of a single switch setting.

According to one aspect, there is further defined in the leakage model, leakage corners (e.g., a statistical measure indicating a 3-σ or greater worse case leakage) and leakage uplift factor(s) due to statistical effect interactively and analytically using device/process variation inputs without time-consuming Monte-Carlo simulations. That is, the leakage model includes uplift factors that model process related and/or device dimension related uncertainties. These uncertainties are modeled in the leakage model as the uplift factors. The leakage model further allows a user to integrate the accurate leakage power calculation at different process corners into a circuit design flow/environment. This integrated design flow and design optimization can be done at different testing level, from single device to full chip design.

Figure 1:
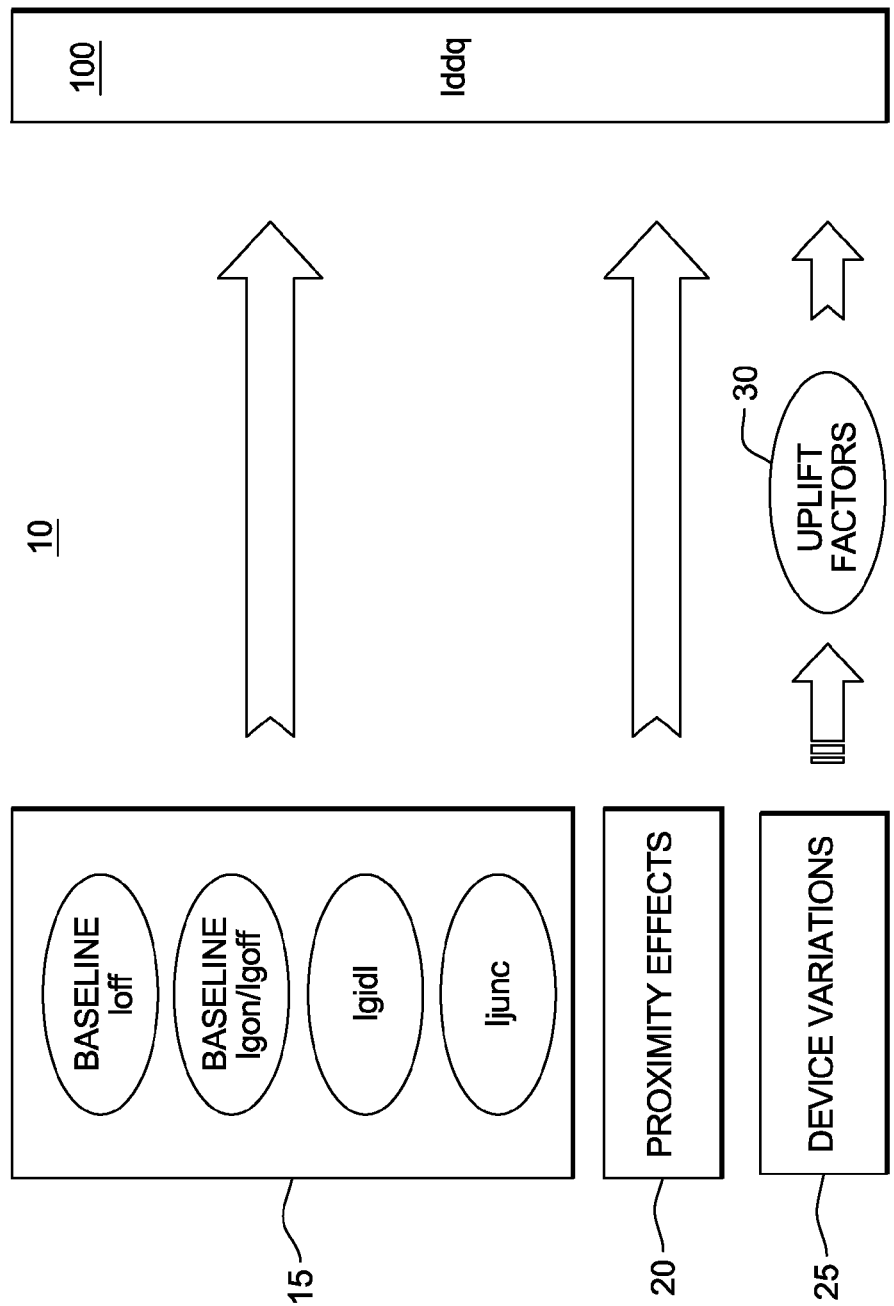
FIG. 1 illustrates a general schematic of the IDDQ model methodology 10 according to an embodiment of the invention. In the IDDQ method, parameters are given that include at least

FIG. 1 illustrates a general schematic of the IDDQ model methodology 10 according to an embodiment of the invention. As shown in FIG. 1, the leakage specific model, and specifically the modeling of IDDQ current 100, accounts for various contributors to the median leakage current including at least the following currents leakage sources 15: a Baseline Ioff current (transistor subthreshold current), a Baseline Igon/Igoff current (gate dielectric tunneling current), an Igidl current (band-to-band tunneling current), and an Ijunc current (diode leakage current). That is:

IDDQ current≈median(Ioff+Igate+Igidl+Ijunc+other)

The IDDQ model 100 further accounts for, in the calculation of IDDQ current, modifying parameters such as parasitic and proximity effects 20, and further calculates and incorporates various uplift factors 30 based on device design variations 25 to be incorporated for IDDQ leakage current calculation. For example, an uplift factor comprises a ratio of a mean value over median value (i.e., a scaling factor applied on top of baseline leakage current). For example, while the modeling of a single transistor (single device) in one example embodiment, may result in a single baseline current value; however, when modeling an array of identical transistor devices (e.g., on a bigger chip), due to the non-linear behavior of transistors or their distribution, a testing of all leakage current of all these identical transistors will not be a linear sum of the single device value and there is uplift (an impact that is accounted for in the leakage model). As shown in FIG. 1, the device variations (or portions thereof) are used to model the uplift factors and the computed uplift factors are applied, in conjunction with the proximity effects, to determine total leakage current.

Figure 2:
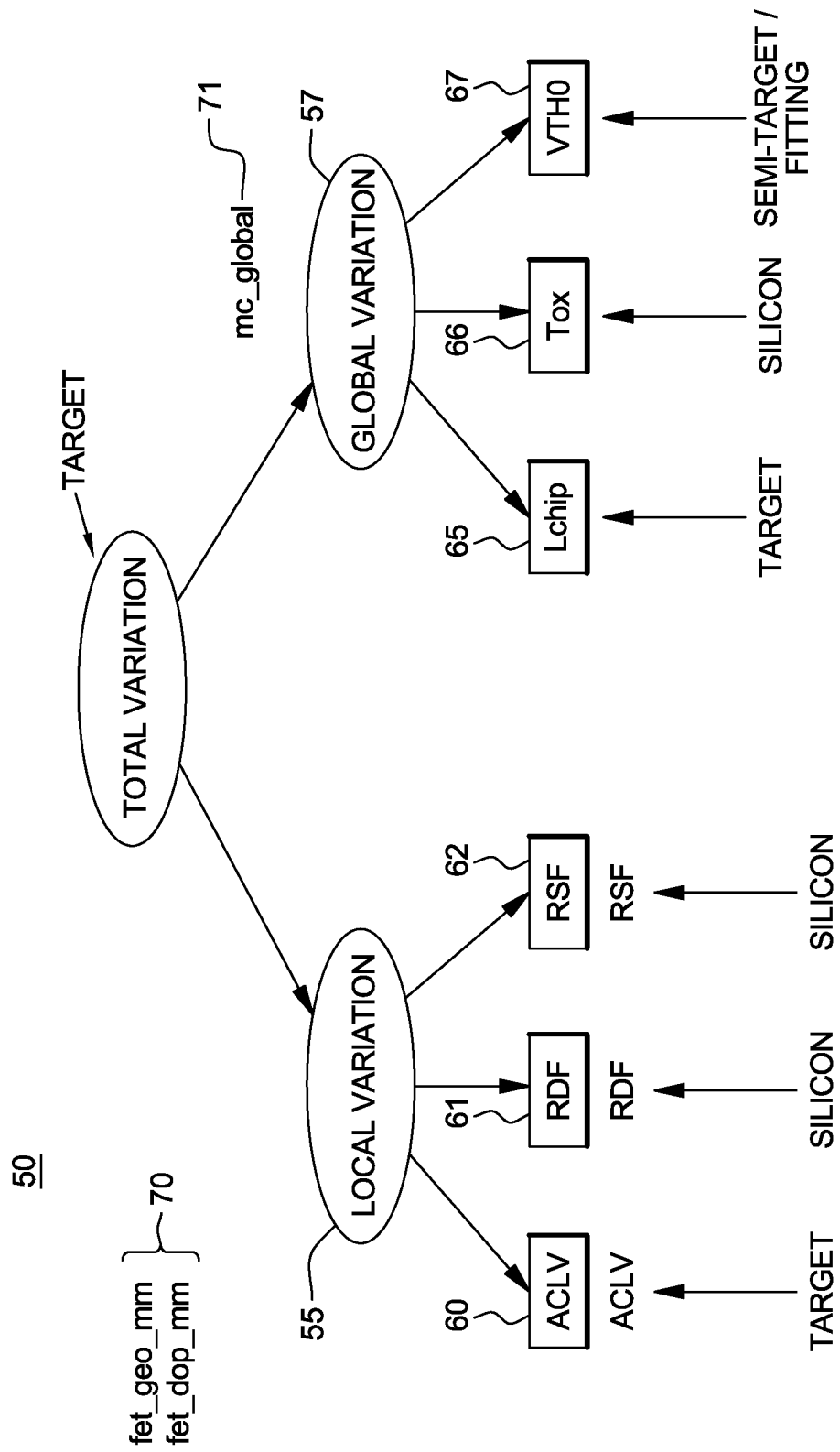
FIG. 2 illustrates a device variation modeling approach 50 used in the determining of uplift factor(s) for the IDDQ model methodology.

FIG. 2 illustrates the device variation modeling approach 50 used in the determining of uplift factor(s). A total device variation, such as specified as a target variation 55 consists of two parts: a first part accounting for local variation 55 across chip; and, 2) a second part accounting for global device variations 57 which are chip to chip variations. The local variations 55 may include variation components including: ACLV 60 representing Across Chip Local Variation (dimension variation); RDF (random dopant fluctuation) 61 which variation affects V threshold voltage (Vt) (e.g., of an FET) and, RSF (Random Slope Fluctuation) RSF 62 which variation affects sub-threshold slope. The global variations 57 may include variation components including: Lchip 65 representing chip mean variation (e.g., from chip to chip there are changes in chip mean gate length); Tox 66 which represents chip to chip variation of oxide thickness (dimension variation); and, $Vth_0$ 67 (long-channel threshold voltage variation from chip to chip. As further shown in FIG. 2, the model employs switches 70, e.g., fet_geo_mm, fet_dop_mm, which are provided to enable (turn on/turn off) geometry-related variation or dopant-related variations, and mc_global switch 71 provided to turn on/turn off global-related variations.

Figure 3:
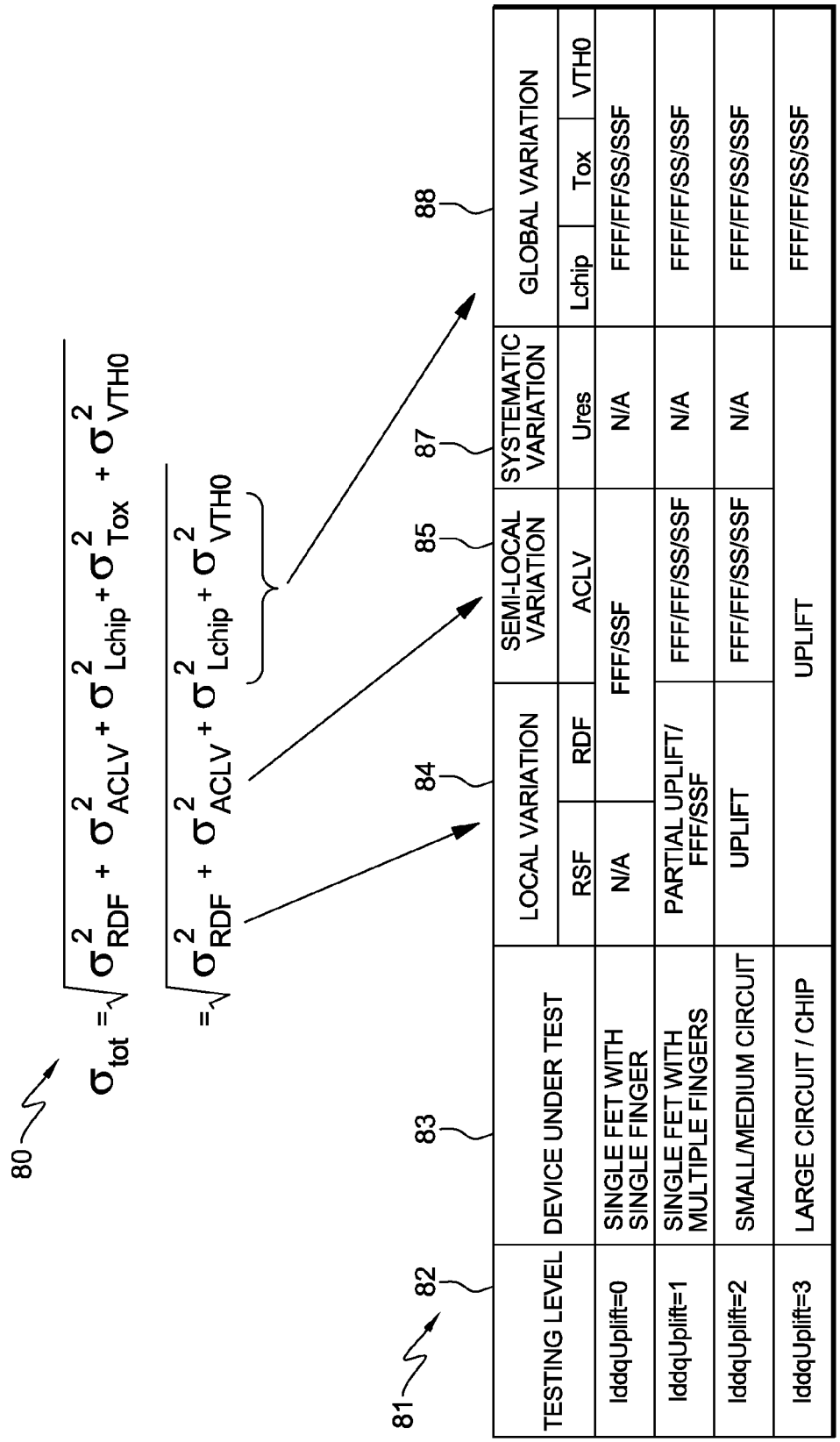
FIG. 3 illustrates a formula equation 80 that summarizes computation of IDDQ uplift and corners factors and particularly how a total variation, $\sigma_{tot}$, includes a sum of various components at the device/circuit/chip level.

FIG. 3 depicts an equation 80 that summarizes computation of Iddquplift and corner factors and particularly how the total variation, represented as term $\sigma_{tot}$, is composed of the variations components mentioned at the device/circuit/chip levels. In the equation 80, the $\sigma_{tot}$ shown is a function of $\sigma_{RDF}$ (variation due to the random dopant fluctuations), $\sigma_{ACLV}$ (variation due to dimension variations across chip), $\sigma_{LChip}$ (variation due to changes in length from chip to chip), and $\sigma_{Vth0}$ (variation due to non-channel threshold voltage variation from chip to chip). Example values contributing to uplift factors at the device/circuit/chip levels is shown as provided in the table 81 in FIG. 3. In a first column 82 depicting testing levels, there are depicted the Iddq uplifts computed at a device level, e.g., for an example switch device (e.g., FET device). The Iddq uplifts computed are shown at various device-under-test levels 83. For example, Iddq Uplift=0 corresponds to device variations computed for a single FET having a single (gate) Finger; Iddq Uplift=1 corresponds to device variations computed for a single FET having multiple (gate) Fingers; Iddq Uplift=2 corresponds to device variations computed for a small/medium circuit; and, Iddq Uplift=3 corresponds to device variations computed for a large circuit or chip. In FIG. 3, column 84 of table 81 shows the local variation values contributing to the corresponding uplifts, column 85 indicates the semi-local variation values contributing to the corresponding uplifts, column 87 indicates systematic variation (systematic variations are those variations which do not have Gaussian random distribution Probability-Density-Function, instead, they are more layout/design pattern/geometry dependent.), and column 88 depicts the global variation values computed for the corresponding uplifts. For example, as can be seen for Iddq Uplift=0, there is no local variation RSF. As further shown in FIG. 3, there is populated in the table 81 device "corner" values for RDF and ACLU at this level as indicated by FFF (fast fast functional) or SSF (slow slow functional) values for both local and global variations). For example, for Iddq Uplift=1, the table 81 includes partial uplift values for local variations due to RSF and RDF (i.e., RSF and RDF variations are function of the number of device fingers/RX numbers. With finite number of device fingers, the variation gets tighter and therefore contribute to partial uplift.). For calculating Iddq Uplift=2, there are contributing uplift values corresponding due to the complete local variations to the small medium size circuit. Moreover, for a large circuit or chip Iddq Uplift=3 in table 81 is shown populated with local, semi-local and systematic variation values contributing this uplift factor. It is understood that at the testing levels depicted in FIG. 3, there are no global variation factors contributing to uplift. These global variation factors do contribute to leakage corner models as will be described herein below in greater detail. Thus table 81 provides example device variation components used to define the device corners and/or leakage uplift used in the leakage model of the embodiment described. Thus, no approximations or experiments are needed to define these specifications to describe how the device behaves.

In one example implementation, the leakage model of the described embodiment computes the uplift factor $\sigma_{RDF}$ (variation due to the random dopant fluctuations) contributing to $\sigma_{tot}$ according to the following equations 1)-3) included in the leakage model. These equations are provided to determine the $\sigma_{RDF}$ as a function of all the parameters that Ioff( ) supports. That is, the format of equations 1)-3) are for: (1) Capturing the Isoff v.s. Vtsat sensitivity with the parameter "slope" which describes the effect slope of log(Isoff) vs. Vtsat by applying a small amount of disturbance to Vtsat (the varying parameter); and, (2) Assuming Vtsat variation is Gaussian-Random-Distribution. These principles apply to all the other uplift factors calculated as described herein below. With these two considerations, the leakage model enables users to: (1) capture the impact of device variation of any supported parameter on the uplift factor without separated fitting equations; and, (2) capture the uplift factor analytically and in the real time without Monte-Carlo simulation.

$$RDF = \exp\left(\frac{\sigma_{Vtsat}^2}{2 slope^2}\right) \quad 1)$$

$$slope = \frac{\eta \cdot \sigma_{Vtsat}}{\ln(10) \cdot [\log(Ioff(Vtsat - \eta \cdot \sigma_{Vtsat})) - \log(Ioff(Vtsat))]} \quad 2)$$

$$\sigma_{Vtsat} = \sigma_{Vtsat0}\left(\frac{W_{nom}}{Wg} \frac{1+PW \cdot Wg}{1+PW \cdot W_{nom}}\right)^{alfaW}\left(\frac{L_{nom}}{Lpoly} \frac{1+PL \cdot Lpoly}{1+PL \cdot L_{nom}}\right)^{alfaL} \quad 3)$$

wherein in equation 1) RDF is equivalent to $\sigma_{RDF}$ and is a function of Vtsat sigma ($\sigma_{Vtsat}$) and a variable slope as shown in equation 1) and the variable slope in equation 1) is calculated according to the formula in equation 2) and, the $\sigma_{Vtsat}$ is calculated according to the formula in equation 3). The Sigma Vth equations can be degenerated to compact model equation for the case IDDQ model want to share the same fitting parameters/fitting equations as compact model to keep the tolerance definition in both models identical. The formulae applied in equations 1)-3) includes five (5) fitting parameters: four fitting parameters alfaW, PW, alfaL, PL for sigma Vth's Wg/Lpoly dependence, and, one (1) fitting parameter η for uplift factor that can empirically set to 2, in an example embodiment.

Similarly, in one example implementation, the leakage model of the described embodiment computes the uplift factor $\sigma_{ACLV}$ (variation due to dimension variations across chip) that contributes to $\sigma_{tot}$ according to the following equations 4)-5) included in the leakage model. These equations are provided to determine the $\sigma_{ACLV}$ as a function of all the parameters that Ioff( ) supports. That is, the format of equations 1)-3) are for: (1) Capturing the Isoff v.s. Lpoly sensitivity with the parameter "slope" which describes the effect slope of log(Isoff) vs. Lpoly by applying a small amount of disturbance to Lpoly (the varying parameter); and, (2) Assuming Lpoly variation is Gaussian-Random-Distribution. These principles apply to all the other uplift factor calculations described herein. With these two considerations, the leakage model enables users to: (1) Capture the impact of device variation of any supported parameter on the uplift factor without separated fitting equations; and, (2) Capture the uplift factor analytically and in the real time without Monte-Carlo simulation.

$$ACLV = \exp\left(\frac{\sigma_{Lpoly}^2}{2 slope^2}\right) \quad 4)$$

$$slope = \frac{\eta \cdot \sigma_{Lpoly}}{\ln(10) \cdot [\log(Ioff(Lpoly - \eta \cdot \sigma_{Lpoly})) - \log(Ioff(Lpoly))]} \quad 5)$$

wherein in equation 4) ACLU is equivalent to $\sigma_{ACLV}$ and is a function of Lpoly sigma ($\sigma_{Lpoly}$ which is typically given as a technology target or process assumption.) and a variable slope as shown calculated in accordance with equation 5). The formulae applied in equations 4)-5) may include only zero or one fitting parameter η that can empirically set to 2, in an example embodiment.

Figure 4:
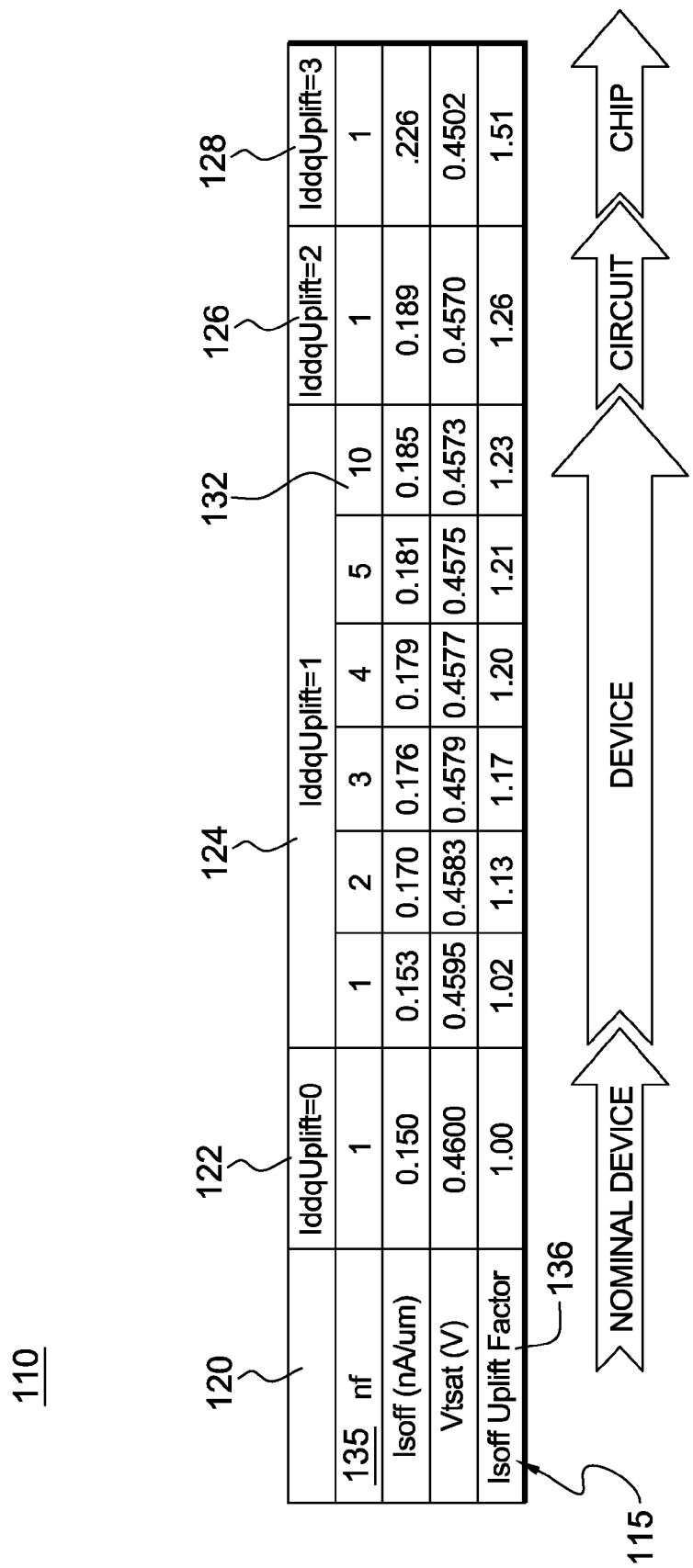
FIG. 4 illustrates how a particular Iddq Uplift switch 110 is implemented in the IDDQ leakage model of the present invention for providing the uplift factors.

Referring to FIG. 4 there is depicted how a particular Iddq Uplift switch 110 is implemented in the IDDQ leakage model of the present invention to provide the uplift factors. This IDDQ uplift switch is a software construct that is implemented in the leakage model to separate the leakage current calculations using IDDQ uplift at the device level, for example, from the circuit or chip levels. When simulating a particular circuit or chip design, a user can specify the switch, for example, and the corresponding functions for computing uplift factor(s) will become automatically invoked for the leakage current model. Particularly, FIG. 4 illustrates for exemplary purposes a table 115 that includes columns 120, . . . , 128 associated with various levels of the design (e.g., at device, circuit, chip level) and rows that include the calculated IDDQ leakage current uplift values leveraged by the switch for a leakage current calculation at a specified level. For example, a first column 122 includes the IDDQ uplift factor 0 (i.e., switch=0) for a nominal case of an example single transistor having a single finger, i.e., Number of Fingers value "nf" specified in a row 135 of table 115 having a value of 1 (a single finger gate FET device) as shown in FIG. 4. In this column 120 the system has calculated example values for Isoff (nA/um), Vtsat (V), and the example total Isoff Uplift Factor value in the last row 136 of table 115, for the subject device (e.g., single gate FET device). In this example there is no uplift.

This is to be contrasted with the IDDQ Uplift factor 1 values (i.e., switch=1), specified for an example single transistor FET device designed with one or more fingers, e.g., a single finger (nf=1) or multiple fingers (nf=2, . . . , 10), such as shown in column 124, row 135 sub-columns 132. In this column 124 and sub-columns 132 the system has calculated the example values for (leakage current Isoff contributed from source) (nA/um), Vtsat (V), and the total Isoff Uplift Factor value in the last row 136 of table 115, for the subject device (e.g., single gate or a single multi-fingered gate FET device). It is understood that in the embodiment depicted in FIG. 4, the example uplift factor values for this type of device are calculated to account for gate edge roughness as the RDF is a function of nf. Thus, as shown in FIG. 4, the Isoff (nA/um), Vtsat (V), and the total Isoff Uplift values for Isoff are generally shown increasing in value as the number of gate fingers of the transistor device increases. It is understood that other leakage values contributing to Uplift factor values, e.g., Idoff, Igon, Igoff, Igidl, may be included in the data table such as shown in FIG. 4.

Continuing, similar to calculating uplift for the nominal device and device (columns 122, 124), the IDDQ Uplift factor values (i.e., switch=2), are provided as specified for circuit level testing at column 126, FIG. 4. The example Isoff values provided for circuit level testing at column 126 show an even greater total Isoff Uplift Factor value in the last row 136 of table 115 largely due to the impact of Gate Edge Roughness (GER) and RDF. Thus, the total leakage current is calculated when testing at the circuit level having these types of single fingered gate or multi-fingered gates provided, in an example embodiment.

Moreover, for testing at the chip level, chip leakage is determinable and the corresponding IDDQ Uplift factor 3 values (i.e., switch=3) are provided as specified for chip level testing at column 128, FIG. 4. The example Isoff values provided for circuit level testing at column 128 show an even greater total Isoff Uplift Factor value in the last row 136 of table 115 largely due to the contribution, in the chip, of all the circuits and within these circuits, instances of each of the single fingered gate or multi-fingered gates in which all uplift factors impact and are applied when testing at the chip level.

Thus, the IDDQ Uplift factors 0, . . . , 3 such as shown having example Isoff values in the example table 115 of FIG. 4, are applied depending upon the scope of the particular application: e.g., whether a device engineer is modeling performance of or calibrating a device in which case IDDQ Uplift is 0 or 1; or, whether a circuit designer who may be interested in how a circuit performs, may look at the circuit and apply an IDDQ Uplift equal to 2; or, whether a product engineer who may be interested in chip leakage power, may look at the chip and apply an IDDQ Uplift equal to 3 (chip level). Thus, the leakage model applying is applicable for all applications.

Figure 5:
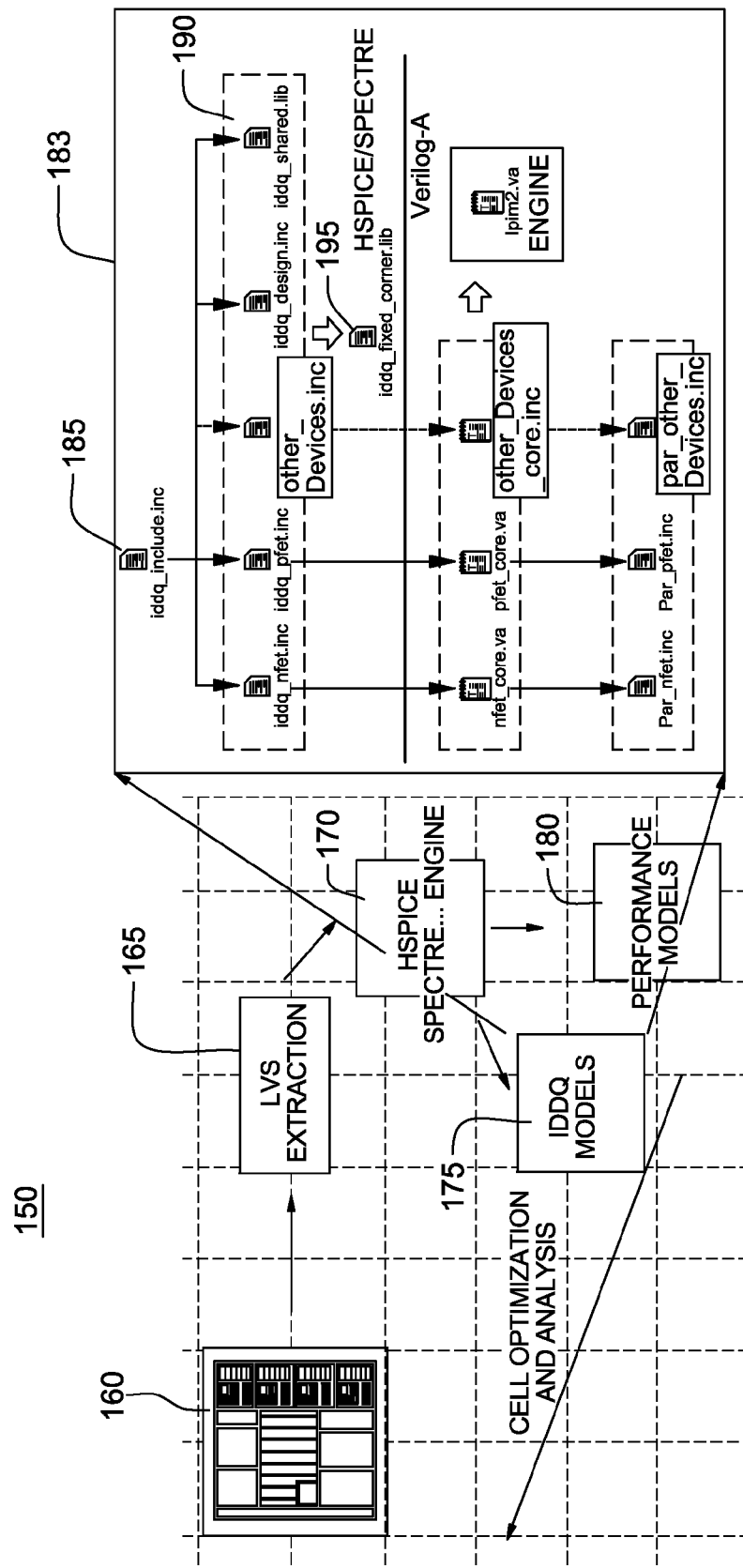
FIG. 5 illustrates an example IDDQ SPICE Model Topology and Working Flow 150 according to one embodiment.

FIG. 5 illustrates an example IDDQ SPICE Model Topology and Working Flow 150 according to the present invention. In connection with FIG. 5 it is assumed that electronic design automation steps include at least steps of determining that a particular device/circuit/chip layout satisfies Design Rules (a series of parameters recommended for faultless fabrication). Design rule checking is a major step during physical verification of the design, which also involves LVS (layout versus schematic). That is, as shown in FIG. 5, after a Design Rules Check (DRC), where such a component, circuit or chip layout 160 is ensured to have adhered to any imposed design rules, a Layout Versus Schematic (LVS) step is performed 165. In one example, LVS software, such as available from Cadence Design Systems, Inc. (San Jose, Calif.), is a program enabling a VLSI designer to compare netlists from the chip layout 160, and a schematics program to ensure that what was laid out in the netlist is what was set out in the circuit schematic. A determinable LVS error, for example, would be when the W and L values of the transistors in a schematic window do not match with the W and L values of the transistors in the layout. One way the LVS tool does this is by generating a netlist file from the layout 165 and comparing it with the netlist for the schematic. In one embodiment, the netlist generated may be in a format suitable for running via a specific simulator tool such as HSPICE, and HspiceS simulator (both available from Synopsys, Inc. (Mountain View, Calif.)) or, Spectre and SpectreS simulator (both available from Cadence Design Systems, Inc.).

For example, in the SPICE Model Topology and Working Flow 150, the LVS tool extracts all the connectivities, parasitic capacitances from the layout design as it recognizes connections and all the nMOS and pMOS transistors. It is noted that a user may enter, via the LVS tool interface, an entry for setting a switch which will open an interface for a user to select any one of various options, e.g., extract parasitic capacitances.

From the LVS comparison, if no errors are found, e.g., the W and L values of the transistors in a schematic window do match with the W and L values of the transistors in the layout, the process proceeds to 170, FIG. 5, where the netlist file is run, e.g., in a simulator program, such as HSPICE, and HspiceS simulator (available from Ssynopsys, Inc.) or, Spectre and SpectreS, running on a computer system, e.g., a Windows, LINUX or UNIX machine. It is within the simulator 170 that supports netlist simulation with circuit simulator that the IDDQ model 175 is implemented. Thus, for example, the netlist may be in an HSPICE format, or is implemented using Verilog-A modeling language. As can be seen in FIG. 5, besides the generation of performance models 180 depicting performance behavior of a given design, the system and method of the described embodiments additionally provide for the IDDQ modeling. For exemplary, purposes, application program interfaces (API) such as a C, C++ program, etc., is provided for either the System Verilog language and/or HSpice formats, to calculate the IDDQ uplift and corners factors and implement them in the IDDQ model 175. For purposes of discussion, the extensions for the IDDQ uplift and corner modeling calculations is provided as one or more APIs, an example pseudo-code depiction of which is provided herein below. As shown in FIG. 5, one implementation of an IDDQ model structure 183 is shown with a top level IDDQ include file 185 that includes models for all supporting transistors and, further supports models 190 for different transistor sub-structures and includes an iddq_fixed_corner library 195 all formatted in accordance with the simulator tool (e.g., Hspice, the model being simulator dependent). A Verilog-A version of the model 175 is provided that can be further used in other device and circuit design simulators. In either implementation, the model is runnable as a standalone SPICE model or integrated and/or coupled with performance models 180 for the maximum flexibility.

In the following pseudocode, the following variables are defined in Table 1 as follows:

TABLE 1

| Term | Definition |
|---|---|
| Vtlin | Liner Threshold Voltage |
| Vtsat | Saturation Threshold Voltage |
| DIBL | Drain-Induced-Barrier-Lowering |
| Vth | Threshold Voltage |
| T | Temperature |
| Tox | Oxide Thickness |
| Lp, Lpoly | Poly Length |
| Lnom | Nominal Poly Length |
| Wg | Gate Width |
| Wnom | Nominal Gate Width |
| ΔT | Temperature change, referred to 25 C (298 K) |
| ΔTox | Oxide thickness change, referred to nominal Tox |
| ΔVth_BE | Body Effect induced Threshold Voltage Change |
| ΔVth_NCE | Narrow-Channel-Effect induced Threshold Voltage Change |
| subVt1 | Sub-threshold Slope |
| Ichannel | Channel Current with Vgs > Vth |
| Ioff | Leakage Drain-to-Source Current with Vgs <= Vth |
| Ids | Total Drain-to-Source Current |
| Jgate | Gate Leakage Current |
| Jgc | Gate-to-Channel Leakage Current |
| $J_{GOS}$ | Gate-to-Source Overlap Region Leakage Current |
| $J_{GOD}$ | Gate-to-Drain Overlap Region Leakage Current |
| $J_{GIDL}$ | Gate-Induced-Drain-Leakage Current |
| $J_{junc}$ | Junction Leakage Current |
| $I_{subx}$ | Total substrate leakage current including $J_{GIDL}$ and $J_{junc}$ |
| $\sigma_{VthRDF}$ | 1-sigma Random-Dopant-Fluctuation Induced Vth Variation |
| $\sigma_{VthACLV}$ | 1-sigma Across-Chip-Length-Fluctuation Induced Vth Variation |
| $\sigma_{VTH0}$ | 1-sigma Chip Mean Vth Variation |
| $\sigma_{VthTox}$ | 1-sigma Tox Thicness Variation Induced Vth Variation |
| $\sigma_{vthtot}$ | 1-sigma Total Vth Variation |
| $\sigma_{circuit}$ | 1-sigma Total Vth Variation excluding local Vth variation |
| $\sigma_{Lchip}$ | 1-sigma Chip Mean Lpoly Variation |
| $\sigma_{ACLV}$ | 1-sigma Across-Chip Lpoly Length Variation |
| $\sigma_{Tox}$ | 1-sigma Tox Thickness Variation |
| $\sigma_{subVth}$ | 1-sigma subVth Slope Variation |
| $\sigma_{lpoly}$ | 1-sigma Lpoly variation, as a function of iddquplift and corner |
| $\sigma_{vtsat}$ | 1-sigma Vtsat variation, as a function of iddquplift and corner |
| $\sigma_{subx}$ | 1-sigma subVth Slope variation, as a function of iddquplift and corner |
| ACLV | The Isoff Uplift Factor due to Across-Chip-Length-Variation |
| RDF | The Isoff Uplift Factor due to Random-Dopant-Fluctuation |
| RSF | The Isoff Uplift Factor due to Random-subThreshold-Slope-Fluctuation |
| ACOV | The Igate Uplift Factor due to Acoss-Chip-Tox-Variation |
| VDD | Nominal Power Supply Voltage |
| Vds | Drain-to-Source Bias |
| Vgs | Gate-to-Source Bias |
| Vsb | Source-to-Body Bias |

The application code implemented in the model calculates or otherwise obtains these values and incorporates them in the leakage current model employed with use of SPICE and like device/circuit simulator tools. Any other terms that are not summarized in Table 1 are fitting parameters that are used when calibrating the model using, for example, silicon data (after the model calibration, these fitting parameters are assigned constants).

As mentioned, the variables described in Table 1 are utilized in functions that perform the IDDQ leakage current model calculations when modeling device/circuit/chip performance. The functions include: 1) a function for calculating Vth (with bias); 2) a function for calculating delta_Vth shift due to Body-Effect; 3) a function for calculating proximity and Narrow Channel Effects (NCE) included Vth shift; 4) a function for calculating subVt1: subVt1; 5) a function for calculating drain-source current, i.e., Ids=Ichannel+Ioff; 6) a function for calculating Igate current (including both Igon and Igoff); 7) a function for calculating Igidl current, i.e., Igidsl; 8) a function for calculating sigmaVth due to RDF, i.e., sigmaVth_rdf; 9) a function for calculating sigmaVth_alcv due to within chip ACLV variation; 10) a function for calculating sigmaVth_Lchip due to Lchip mean variation; 11) a function for calculating sigmaVth0 due to chip mean VTH variation; 12) a function for calculating sigmaVth_Tox due to Tox variation; 13) a function for calculating total sigmaVth, i.e., sigmaVth_tot; and, 14) a function for calculating sigmaVth for corner definition: sigmaVth_circuit. The pseudocode API provided herein below in example C++ code, begins with defining all ports and electrical connections and then what follows in the pseudocode below is the descriptions of each of the modeling functions used in the modeling of IDDQ:

```
// Define ports and electrical connections. Note: drain and source are swappable.
//////////////////// START OF FUNCTION DEFINITION ////////////////////
1) // The function to calculate Vth with bias: Vth
analog function real Vth;
```

$V_{tlin}(L_p, T, Tox) = V_{tlin}(L_p) + dVtlindT \cdot \Delta T + (subVt_1(L_p, W_g) - 0.06) \cdot dVldX \cdot \Delta Tox$ $V_{tsat}(L_p, T, Tox) = V_{tsat}(L_p) + dVtsatdT \cdot \Delta T + (subVt_1(L_p, W_g) - 0.06) \cdot dVsdX \cdot \Delta Tox$ $$V_{tlin}(L_p) = V_{tolin} + \frac{a_{lin}}{L_p - L_{xlin}} + \frac{b_{lin}}{L_p - L_{olin}} + c_{lin} \cdot e^{-\frac{L_p}{L_{ylin}}}$$

$$V_{tsat}(L_p) = V_{tosat} + \frac{a_{sat}}{L_p - L_{xsat}} + \frac{b_{sat}}{L_p - L_{osat}} + c_{sat} \cdot e^{-\frac{L_p}{L_{ysat}}}$$

$$DIBL(L_p, T, Tox) = V_{tlin}(Lp, T, Tox) - V_{tsat}(Lp, T, Tox)$$

$$Vth(L_p, T, Tox, V_{ds}) = V_{tlin}(L_p, T) - DIBL(L_p, T, Tox) \cdot \left(\frac{V_{ds} - 0.05}{V_{DD} - 0.05}\right)^{alpha}$$

endfunction // End: Vth
2) // The function to calculate delta_Vth shift due to Body-Effect: dVth_BE
analog function real dVth_BE;

$$\Delta Vth\_BE = \left[aBE + \frac{Vtlin + \Phi_1}{DIBL \cdot (Vds + \Phi_2) + \Phi_3}\right] \cdot bBE \cdot Vsb$$

endfunction // End: dVth_BE
   3) // The function to calculate proximity and NCE included Vth shift: dVth_prox
      analog function real dVth_prox;

$$\Delta Vtsat\_NCE = frdVt \cdot \left(a\_NCE \cdot \left[\exp\left(-\frac{Wg - W_{nom}}{W_x}\right) - 1\right] + b\_NCE \cdot \left(\frac{W_{nom} - W_o}{Wg - W_o} - 1\right)\right)$$

$$frdVt = 1 - rdvt \cdot [1 - e^{Lrdvt \cdot (L_{nom} - L_p)}]$$

$$rNCE = \max\left(S\_NCE \cdot \left[\exp\left(-\frac{Wg - W_{nom}}{W_y}\right) - 1\right], -1\right)$$

as well as Well-Proximity effect and STI effect.
endfunction // End: dVth_prox
   4) // The function to calculate subVt1: subVt1 :analog function real subVt1;

$$subVtot_1 = \frac{L_{dVt} \cdot C_{rsub} \cdot V_{tsat\_cor}}{\ln\left(\frac{B_{rsub} + C_{rsub} \cdot e^{L_{dVt} \cdot V_{tsat\_cor}}}{B_{rsub} + C_{rsub}}\right)} + (subVt_1(L_p, W_g) - 0.06) \cdot dS_1 dX \cdot \Delta Tox$$

$$V_{tsat\_cor} = V_{tsat}(L_p, W_g, WPE, Vt_{adder}) + \Delta V_{tsat}$$

$$subVt_1(L_p, W_g) = \left(S_{10} + S_{11} \cdot e^{-\frac{L_p}{L_{y1}}} + \frac{V_{subo}}{L_p}\right) \cdot (1 + rNCE) - 0.06 \cdot rNCE$$

$$B_{rsub} = C_{rsub} \cdot \frac{e^{L_{dVt} \cdot V_{tsat}(L_p, W_g, WPE, Vt_{adder})} - e^{\frac{L_{dVt} \cdot C_{rsub} \cdot V_{tsat}(L_p, W_g, WPE, Vt_{adder})}{subVt_1(L_p, W_g)}}}{e^{\frac{L_{dVt} \cdot C_{rsub} \cdot V_{tsat}(L_p, W_g, WPE, Vt_{adder})}{subVt_1(L_p, W_g)}} - 1}$$

$$fsub(T) = 1 + dSdT \cdot (T - 298) \cdot (1 + bT \cdot T)$$
endfunction // End: subVt1
   5) // The function to calculate drain-source current: Ids
      analog function real Ids;

$$Ichannel = Icho \cdot \left(\frac{T}{298}\right)^{ut} \frac{vdo + 1}{vdo + \left(\frac{Vgs}{Vdd}\right)^{uv}} \cdot \frac{luo + 1}{luo + \left(\frac{L_{poly}}{L_{nom}}\right)^{ul}} \cdot Wg \cdot \max(\min(Vgs - Vth, \lambda \cdot Vds), 0)^{\beta 1}$$

$$\left[Vgs - Vth - \frac{\min(Vgs - Vth, \lambda \cdot Vds)}{2}\right]^{\beta 2}$$

$$I_{off} = \min\left(\begin{array}{c} 1.2 \cdot J_o \cdot \frac{Wg}{L_p}, \\ J_o \cdot \frac{Wg}{L_p} \cdot 10^{\frac{Vth - Vgs + \Delta Vtsat\_NCE + \Delta Vth\_BE}{subVth \cdot fsub(T)}} \cdot \left(1 - e^{-\frac{Vds}{0.01}}\right) \end{array}\right)$$

$$Vth = V_{tlin}(L_p, T) - DIBL(L_p, T, Tox) \cdot \left(\frac{V_{ds} - 0.05}{V_{DD} - 0.05}\right)^{alpha}$$

$$subVth = \frac{Vth - Vgs}{\frac{Vth}{subVt1} - \frac{Vgs}{subvtvg}}$$

$subvtvg = subVtho + rsub1 \cdot (subVtot_1 - 0.06) \cdot (Vgs - Vtsat(25C))^{1.5} \cdot e^{-Lsub1 \cdot Vds}$
$subVt1 = subVtho + rsub1 \cdot (subVtot_1 - 0.06) \cdot (Vth(25C) - Vtsat(25C))^{1.5} \cdot e^{-Lsub1 \cdot Vds}$
$subVtho = (subVtot_1 - subx) \cdot e^{-Lsub0 \cdot (Vth(25C) - Vtsat(25C))} + subx$
$subx = S_{10} + rsub0 \cdot (subVtot1 - S_{10})$
Ids = Ichannel + Ioff;
endfunction // End: Ids
   6) // This function is to calculate Igate current (including both Igon and Igoff): Igate
analog function real Igate;
$$J_{GATE} = J_{GC} + J_{GOS} + J_{GOD}$$

$$J_{GC} = L_{poly}A_{F,GC}E_{eff,GC}^2\exp\left(-\frac{B_{F,GC}}{|E_{eff,GC}|}\right)\cdot\max\left(1-e^{-\frac{max(V_{GS},V_{GD})}{0.01}},0\right)$$

$$J_{GOS} = -\frac{L_{ov}}{2}A_{F,OV}E_{eff,GOS}^2\exp\left(-\frac{B_{F,OV}}{|E_{eff,GOS}|}\right)\cdot\max\left(1-e^{\frac{V_{GS}}{0.01}},0\right)$$

$$J_{GOD} = -\frac{L_{ov}}{2}A_{F,OV}E_{eff,GOD}^2\exp\left(-\frac{B_{F,OV}}{|E_{eff,GOD}|}\right)\cdot\max\left(1-e^{\frac{V_{GD}}{0.01}},0\right)$$

$A_{F,GC}(T) = A_{F0}/[1 - A_{T1} \cdot (T - 298)]$
$A_{F,OV}(T) = A_{F0}/[1 - A_{T2} \cdot (T - 298)]$
$B_{F,GC}(T) = B_{F1} \cdot [1 - B_{T1} \cdot (T - 298)]$
$B_{F,OV}(T) = B_{F2} \cdot [1 - B_{T2} \cdot (T - 298)]$ $$E_{eff,GC} = \frac{\max(V_{GS}, V_{GD}) - V_{corr1}}{T_{oxgl,mea} * (1 + \tanh((T_{oxgl,mea} - T_{oxgl,nom})/TGL1))}$$

$$E_{eff,GOX} = \frac{V_{GX} - V_{corr2}}{T_{oxgl,mea} * (1 + \tanh((T_{oxgl,mea} - T_{oxgl,nom})/TGl2))}, X = S/D$$

endfunction // End: Igate
  7) // This function is to calculate Igidl current: Igidsl analog function real Igidsl;

$$J_{GIDL} = \left[A_F E_{eff}^2 \exp\left(-\frac{B_F}{E_{eff}} + \xi_1 V_{tsat}\right)\right]^{CoeBE} \cdot \max\left(1 - e^{-\frac{V_{db}}{0.01}}, 0\right)$$

$$CoeBE = 1 + (\xi_2 V_{dg} + V_{gbo}) \cdot [1 - \exp(-\xi_3 \cdot e^{-\xi_4 V_{dg}} \cdot V_{gb})]$$

$$A_F(T) = \frac{A_{F0}}{1 - A_T \cdot (T - 298)}$$

$$B_F(T) = B_{F0} \cdot [1 - B_T \cdot (T - 298)]$$

$$E_{eff} = (V_{dg} - V_{corr}) \cdot \frac{\varepsilon_{ox}}{T_{oxgl,nom}\varepsilon_{si}}$$

$$J_{junc} = I_{jo} \cdot e^{CT \cdot T} \cdot \left(e^{\frac{-V_{db} \cdot 298}{0.026 \cdot T}} - 1\right)$$

$I_{subX} = W_{eff} \cdot (J_{GIDL} - J_{junc})$
endfunction // End: Igidsl
  8) // This function is to calculate sigmaVth due to RDF: sigmaVth_rdf
analog function real sigmaVth_rdf;

$$\sigma_{VthRDF} = \sigma_{Vtsat0}\left(\frac{W_{nom}}{Wg}\frac{1 + PW_{rdf} \cdot Wg}{1 + PW_{rdf} \cdot W_{nom}}\right)^{alfaW_{rdf}}\left(\frac{L_{nom}}{Lpoly}\frac{1 + PL_{rdf} \cdot Lpoly}{1 + PL_{rdf} \cdot L_{nom}}\right)^{alfaL_{rdf}}$$

endfunction // End: sigmaVth_rdf
  9) // This function is to calculate sigmaVth_alcv due to within chip ACLV variation:
sigmaVth_aclv analog function real sigmaVth_aclv;

$$\sigma_{VthACLV} = abs\left(\frac{Vth(L_p - \eta_{aclv} \cdot \sigma_{Laclv}, T, Tox, V_{ds}) - Vth(L_p, T, Tox, V_{ds})}{\eta_{aclv}}\right)$$

endfunction // End: sigmaVth_aclv
  10) // This function is to calculate sigmaVth_Lchip due to Lchip mean variation:
sigmaVth_Lchip analog function real sigmaVth_Lchip;

$$\sigma_{VthLchip} = abs\left(\frac{Vth(L_p - \eta_{lchip} \cdot \sigma_{lchip}, T, Tox, V_{ds}) - Vth(L_p, T, Tox, V_{ds})}{\eta_{lchip}}\right)$$

endfunction // End: sigmaVth_Lchip
  11) // This function is to calculate sigmaVth() due to chip mean VTH variation:
sigmaVth()

$$\sigma_{VTH0} = \sigma_{vtho}\left(\frac{W_{nom}}{Wg}\frac{1 + PW_{vtho} \cdot Wg}{1 + PW_{vtho} \cdot W_{nom}}\right)^{alfaW_{vtho}}\left(\frac{L_{nom}}{Lpoly}\frac{1 + PL_{vtho} \cdot Lpoly}{1 + PL_{vtho} \cdot L_{nom}}\right)^{alfaL_{vtho}}$$

endfunction // End: sigmaVth()
  12) // This function is to calculate sigmaVth_Tox due to Tox variation: sigmaVth_Tox -continued analog function real sigmaVth_Tox;
$$\sigma_{VthTox} = dVtsatdT \cdot \sigma_{Tox}$$
endfunction // End: sigmaVth_Tox
13) // This function is to calculate total sigmaVth: sigmaVth_tot analog function real sigmaVth_tot;

$$\sigma_{vthtot} = \sqrt{\sigma_{VthRDF}^2 + \sigma_{VthACLV}^2 + \sigma_{VthLchip}^2 + \sigma_{VthTox}^2 + \sigma_{VTH0}^2}$$

$$= \sqrt{\sigma_{Vthdop}^2 + \sigma_{Vthlpoly}^2 + \sigma_{VthTox}^2}$$

$$= a \cdot \sigma_{Vthdop} + b \cdot \sigma_{Vthlpoly} + c \cdot \sigma_{VthTox}$$

where $a = \dfrac{\sigma_{Vthdop}}{\sigma_{vthtot}}, b = \dfrac{\sigma_{Vthlpoly}}{\sigma_{vthtot}}, c = \dfrac{\sigma_{VthTox}}{\sigma_{vthtot}}$ endfunction // End: sigmaVth_tot
14) // This function is to calculate sigmaVth for corner definition: sigmaVth_circuit analog function real sigmaVth_circuit;

$$\sigma_{circuit} = \sqrt{(cc_1 \cdot \sigma_{VthACLV})^2 + (cc_2 \cdot \sigma_{VthLchip})^2 + (cc_3 \cdot \sigma_{VthTox})^2 + (cc_4 \cdot \sigma_{VTH0})^2}$$

$$= \sqrt{(c_1 \cdot \sigma_{Vthlpoly})^2 + \sigma_{VthTox}^2 + (c_2 \cdot \sigma_{VTH0})^2}$$

$$= a \cdot \sigma_{Vthlpoly} + b \cdot \sigma_{VthTox} + c \cdot \sigma_{VTH0}$$

where $a = \dfrac{c_1 \cdot \sigma_{Vthlpoly}}{\sigma_{circuit}}, b = \dfrac{\sigma_{VthTox}}{\sigma_{circuit}}, c = \dfrac{c_2 \cdot \sigma_{VTH0}}{\sigma_{circuit}}$ $$c_1 = \sqrt{\dfrac{1 + corcoef\_lchip}{2}} \quad c_2 = \sqrt{\dfrac{1 + corcoef\_vtho}{2}}$$

endfunction // End: sigmaVth_circuit
///////////////////// END OF FUNCTION DEFINITION /////////////////////

Figure 6A:
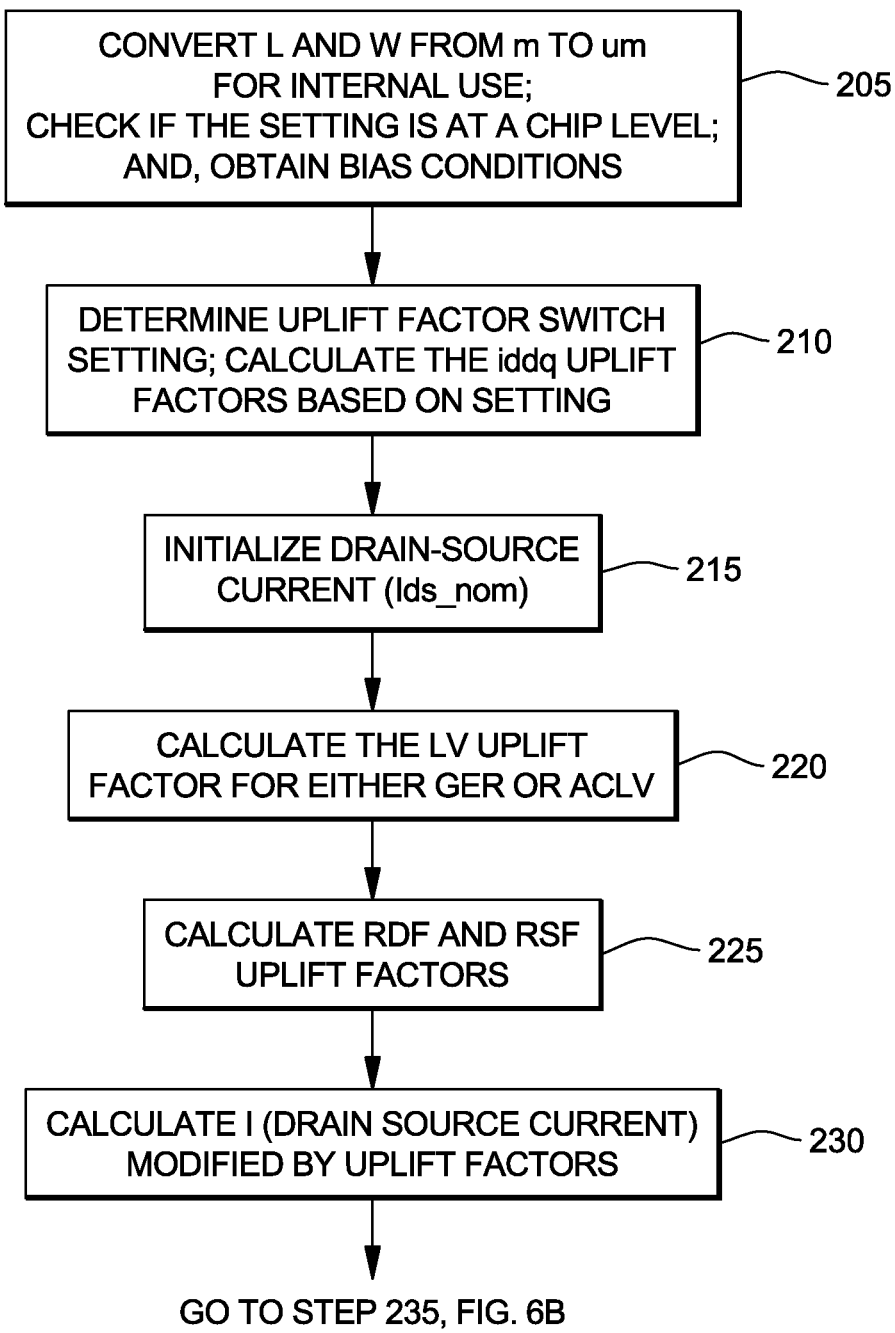
FIGS. 6A and 6B depict an implementation of the IDDQ modeling method that can be called from a simulator program for precise current leakage assessment of a device/circuit/chip level design; and, FIG. 7 shows a computing environment that may be used to carry out the invention.
Figure 6B:
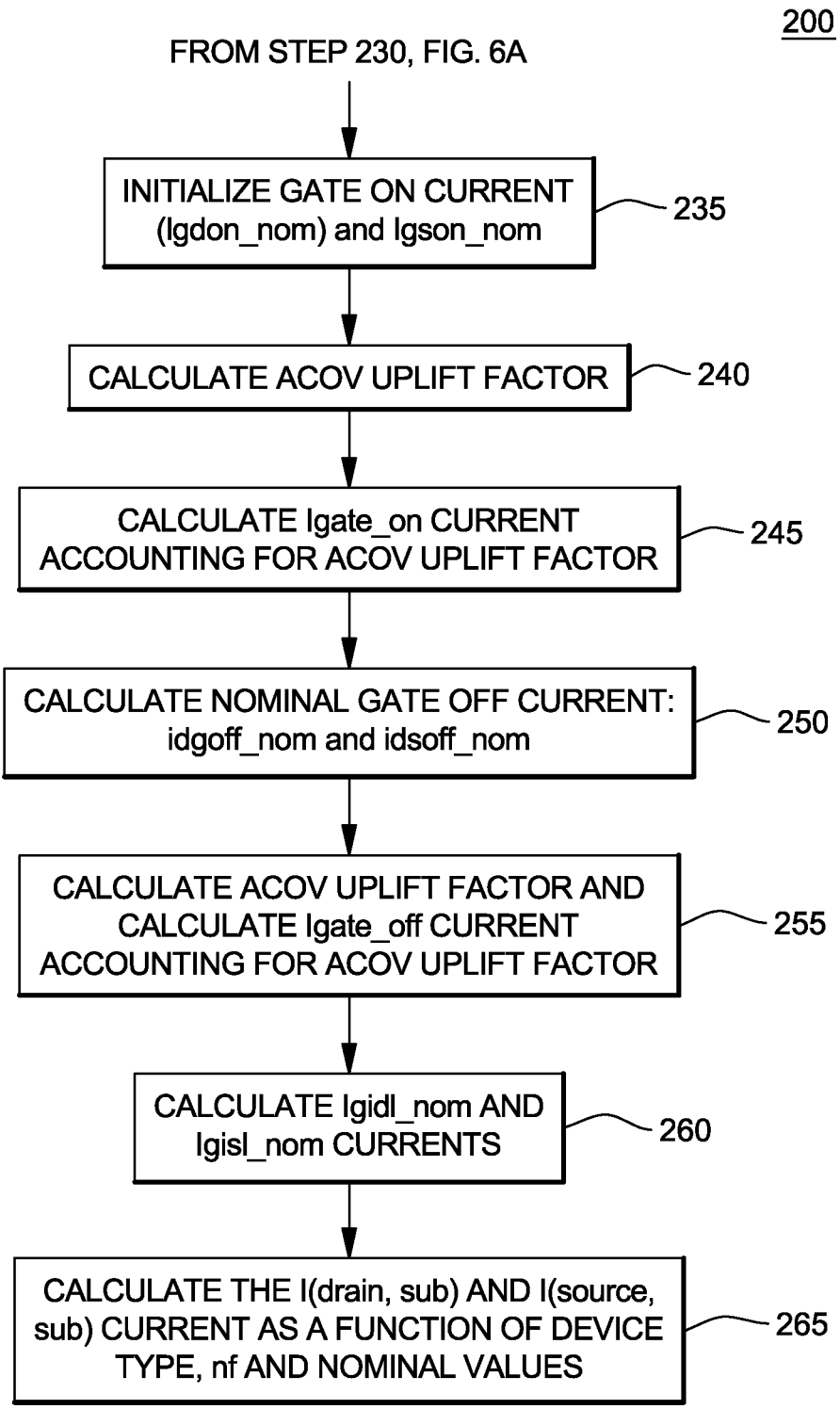

FIGS. 6A and 6B depict an implementation of the IDDQ modeling method implementing the functions defined herein. For the exemplary case, the method is described with respect to modeling a device performance of, e.g., a single FET transistor device. As shown in FIG. 6A, a main processing block 200 includes at 205 first performing any necessary conversions, e.g., converting L and W from m to μm, performing a check if the setting is at chip level, and obtaining any bias conditions (i.e., define the correct Vgs, Vgd, Vgsub . . . bias by aligning the correct node name to Source/Drain nodes—this model is source/drain exchangeable for both NMOS and PMOS devices) that are to be input to the model. For the model, the application receives user input, such as provided via a user interface implemented within the system, for selecting the IDDQ uplift switch. Alternately, a default IDDQ uplift switch setting may be implemented. In one embodiment, a user may enter, via a simulator tool interface (not shown), an entry for setting a switch which will open an interface for a user to select an option, e.g., IDDQ uplift switch corresponding to aforementioned IDDQ Uplift factors 0, . . . , 3. The IDDQ Uplift factor setting should be done at the beginning of simulations and should be compatible with the design environment/testing condition as explained with respect to FIG. 3.

The main processing block described in FIGS. 6A and 6B is depicted in the example Verilog-A pseudocode and form an extension of the DLL for the HSPICE or similar simulator applications.

```
///////////////////// START OF MAIN BLOCK /////////////////////
    // Begin the main block
analog begin: main_block
    // Get bias conditions
    begin: bias
    end    // End: bias
    // Assign drain-source current
    begin: drain_source_current
    // Define uplift factor according to "iddquplift" setting as indicated at 210, Fig. 6A
        if (iddquplift==0)
            σ_Ipoly = 0;
            σ_vtsat = 0;
            σ_subx = 0;
        else if (iddquplift==1)
            σ_Ipoly = 0;
```

$$\sigma_{vtsat} = \sqrt{\dfrac{\sigma_{VthRDF}^2}{nf}} \; ;$$

-continued $$\sigma_{subx} = \sqrt{\frac{\sigma_{subVth}^2}{nf}};$$

```
else if (iddquplift==2)
    σ_lpoly = 0;
    σ_vtsat = σ_VthRDF;
    σ_subx = σ_subVth;
else if (iddquplift==3)
    σ_lpoly = σ_ACLV;
    σ_vtsat = σ_VthRDF;
    σ_subx = σ_subVth;
end.
```

Further, additional variables may be calculated to model the residual system uplift effects. For example, for the first specified uplift factor switch value additional variables include $\Delta Vtsat_{sys}=0$, $\sigma V_{t\_sys}=0$, $\Delta L_{p\_sys}=0$, where $\Delta Vtsat_{sys}$ is a systematic Vtsat skew between a test site median Vtsat and a product circuit median Vtsat; $\sigma V_{t\_sys}$ is the 1-sigma variation of product circuit Vtsat; and, $\Delta L_{p\_sys}$ is the systematic Lpoly skew between test site median Lpoly and product circuit median Lpoly. The variables $\Delta Vtsat_{sys}$, $\sigma V_{t\_sys}$, and $\Delta L_{p\_sys}$ are used to model the residual systematic uplift effect at chip level. Likewise, for a second specified uplift factor, the variables $\Delta Vtsat_{sys}=0$, $\sigma V_{t\_sys}=0$ and $\Delta L_{p\_sys}=0$ are specified to model a residual system uplift effect; and, for a third specified uplift factor, $\Delta Vtsat_{sys}=0$, $\sigma V_{t\_sys}=0$ and, $\Delta L_{p\_sys}=0$. For a fourth specified uplift factor, the variables $\Delta Vtsat_{sys}$, $\sigma V_{t\_sys}$ and $\Delta L_{p\_sys}$ are defined as follows:

$\Delta Vtsat_{sys} = \Delta vtsat_{sys}, \sigma Vt_{sys} = \sigma vt_{sys}, \Delta L_{p\_sys} = \Delta l_{p\_sys}$.
// Calculate Ids current at different corners, but without uplift factor as indicated at 215, Fig. 6A
$I_{ds\_nom} = Ids(L_{poly}, W_g, T, V_{ds}, \sigma_{VthTox}, \sigma_{VthLchip}, \sigma_{VTH0}, \sigma_{vthtot}, \sigma_{circuit})$;
// Calculate LV uplift factor: for either GateEdgeRoughness (GER) or ACLV as indicated at 220 Fig. 6A $$ACLV = \exp\left(\frac{\sigma_{lpoly}^2}{2slope^2}\right)$$

$$slope = \frac{\eta \cdot \sigma_{lpoly}}{\ln(10) \cdot [\log(Ioff(Lpoly - \eta \cdot \sigma_{lpoly})) - \log(Ioff(Lpoly))]}$$

// Calculate RDF and RSF uplift factors as indicated at 225 Fig. 6A $$RDF = \exp\left(\frac{\sigma_{vtsat}^2}{2slope^2}\right)$$

$$slope = \frac{\eta \cdot \sigma_{vtsat}}{\ln(10) \cdot [\log(Ioff(Vtsat - \eta \cdot \sigma_{vtsat})) - \log(Ioff(Vtsat))]}$$

$$RSF = \exp\left(\frac{\sigma_{subx}^2}{2slope^2}\right)$$

$$slope = \frac{\eta \cdot \sigma_{subx}}{\ln(10) \cdot [\log(Ioff(subVth + \eta \cdot \sigma_{subx})) - \log(Ioff(subVth))]}$$

// Calculate the I drain_source_current as a function of device type, nf, Ids_nom, and uplift factors as indicated at 230 Fig. 6A
    I(drain, source) <+ DevType * nf * Ids_nom * ACLV * RDF * RSF;
end // End: drain_source_current
    // Assign Igon current as indicated at 235 Fig. 6B
begin: Igate_on
    // Nominal Igon
    Igdon_nom = Igate();
Igson_nom = Igate();
    if (iddquplift==3)
$\sigma_{tot} = \sigma_{Tox}$;
    else
$\sigma_{tox} = 0$;
    end
// Calculate ACOV Uplift factor as indicated at 240, Fig. 6B $$ACOV = \exp\left(\frac{\sigma_{tox}^2}{2slope^2}\right)$$

-continued $$\text{slope} = \frac{\eta \cdot \sigma_{tox}}{\ln(10) \cdot [\log(\text{Ig}(\text{Tox} - \eta \cdot \sigma_{tox})) - \log(\text{Ig}(\text{Tox}))]}$$

```
        // Calculate the I(gate, drain) and I(gate, source) current as a function of device
type, nf, Igdon_nom, and uplift factor as indicated at 245, Fig. 6B
    I(gate, drain) <+ DevType * nf * Igdon_nom * ACOV;
    I(gate, source) <+ DevType * nf * Igson_nom * ACOV;
    end // End: Igate_on
        // Calculate nominal gate off current values: Igdoff and Igsoff as indicated at 250,
Fig. 6B
    begin: Igate_off
    // Nominal Idgoff
    Idgoff_nom = Igate();
Isgoff_nom = Igate();
    if (iddquplift==3)
        σ_tox = σ_Tox;
    else
    σ_tox = 0;
    end
        // ACOV Uplift factor
```

$$\text{ACOV} = \exp\left(\frac{\sigma_{tox}^2}{2\text{slope}^2}\right)$$

$$\text{slope} = \frac{\eta \cdot \sigma_{tox}}{\ln(10) \cdot [\log(\text{Ig}(\text{Tox} - \eta \cdot \sigma_{tox})) - \log(\text{Ig}(\text{Tox}))]}$$

```
        // Calculate gate off current values: Igdoff and Igsoff as a function of uplift factor
indicated at 255, Fig 6B (e.g., for iddq uplift switch = 3)
    I(drain, gate) <+ DevType * nf * Idgoff_nom * ACOV;
    I(source, gate) <+ DevType * nf * Isgoff_nom * ACOV;
    end // End: Igate_off
        // Calculate nominal Igidl and Igisl values as indicated at 260, Fig. 6B
    begin: GIDL_Current
    Igidl_nom = Igidsl();
    Igisl_nom = Igidsl();
        // Calculate Igidl and Igisl values as a function of device type, nf, and nominal
values
as indicated at 265, Fig. 6B
    I(drain, sub) <+ DevType * nf * Igidl_nom;
    I(source, sub) <+ DevType * nf * Igisl_nom;
    end // End: GIDL_Current
    In a further step, further calculations regarding the capacitor network is provided
    // Capacitor network
    begin: Displacement_Current
    end // End: Displacement_Current
end // End: main_block
```

Thus, the present invention provides for a self-consistently defined IDDQ corner methodology that is compatible with given process assumptions and device targets. The API requires minimum engineering time for model calibration; and obviates the need to re-calibrate, with updated process assumptions, targets, and/or device centering point. The program is customizable, and can be overwritten for MHC (Model-to-Hardware Correlation) purposes. Also, the present invention provides an easy way to check hardware-targets consistency.

In one embodiment, a DB language script, e.g., such as MS Excel, may be configured that calls the API DLL to perform the programs. Thus, only device dimension and bias condition one by one. However, a leakage current for a flip-flop can not be obtained using the spreadsheet (unless bias conditions are known for all transistors in the circuit. For those applications without provision of a netlist, if the transistor dimensions are known, the spread sheet approach can be used.

The Verilog A-coded model accepts as inputs the netlist and the simulation tool calls the program to perform the current leakage prediction at the device/cell/circuit and chip levels. The design engineer thus has the ability with the present invention to perform circuit designs with greater accuracy. The leakage calculations are much more accurate and the system of the invention enables the inclusion of the leakage calculations into the leakage flow.

As shown in FIG. 5, the IDDQ leakage current modeling as represented by blocks 175, 183 is performed in parallel with the performance modeling block 180 and the operator is afforded the opportunity to perform two device design optimizations at the same time (in parallel).

Figure 7:
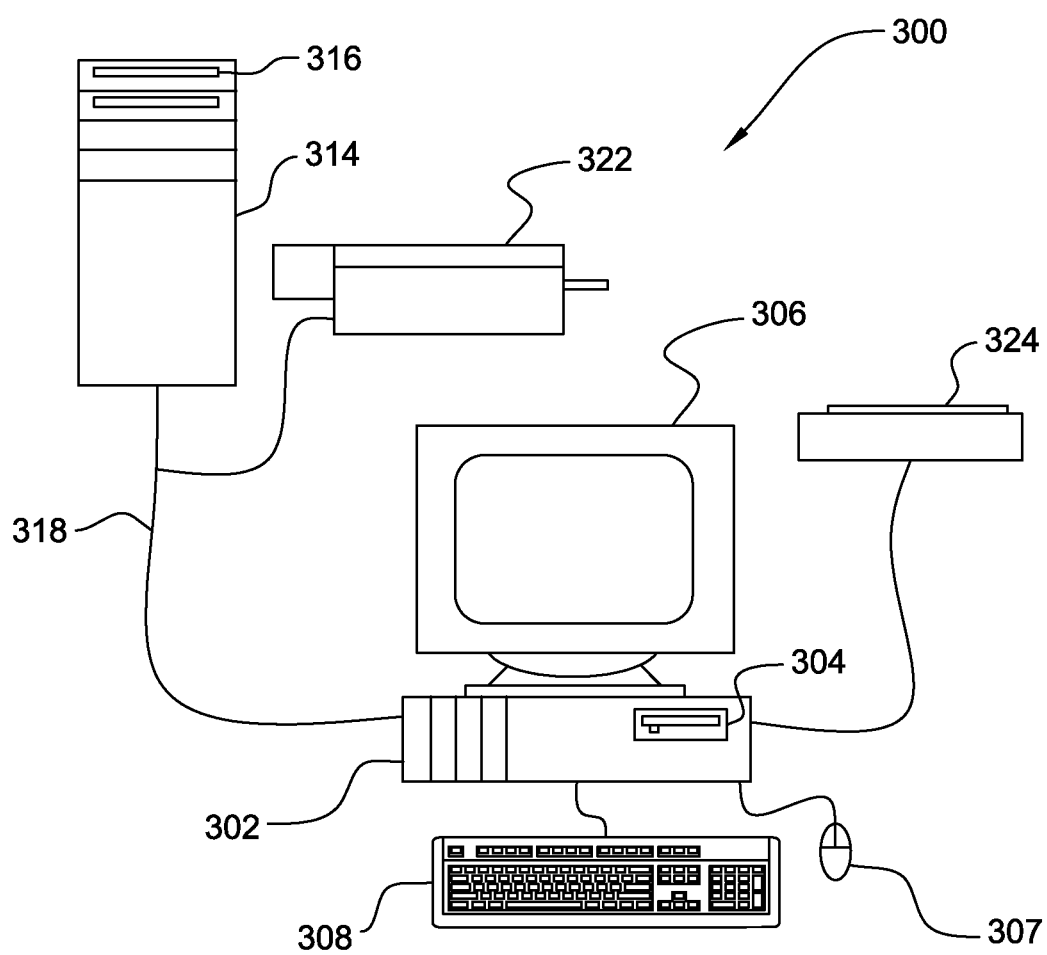

A computer-based system 300 in which a method embodiment of the invention may be carried out is depicted in FIG. 7. The computer-based system 300 includes a processing unit 302, which houses a processor, memory and other systems components (not shown expressly in the drawing) that implement a general purpose processing system, or computer that may execute a computer program product. The computer program product may comprise media, for example a compact storage medium such as a compact disc, which may be read by the processing unit 302 through a disc drive 304, or by any means known to the skilled artisan for providing the computer program product to the general purpose processing system for execution thereby.

The computer program product may comprise all the respective features enabling the implementation of the inventive method described herein, and which—when loaded in a computer system—is able to carry out the method. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product may be stored on hard disk drives within processing unit 302, as mentioned, or disk drives 316 may be located on a remote system such as a server 314, coupled to processing unit 302, via a connection 318 to a network interface such as an Ethernet interface. Monitor 306, mouse 307 and keyboard 308 are coupled to the processing unit 302, to provide user interaction. Scanner 324 and printer 322 are provided for document input and output. Printer 322 is shown coupled to the processing unit 302 via a network connection, but may be coupled directly to the processing unit. Scanner 324 is shown coupled to the processing unit 302 directly, but it should be understood that peripherals might be network coupled, or direct coupled without affecting the ability of the processing unit 302 to perform the methods of the invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A method for simulating an integrated circuit (IC) design in a circuit design simulator, the method comprising:
    receiving data representing a circuit design, said data configured for input to and processing by said circuit design simulator, said data specifying an uplift switch value for an integrated circuit quiescent current (IDDQ) prediction macro, said switch value corresponding to one of: said device, cell, circuit, or IC chip level of design being simulated;
    when simulating said circuit, using said IDDQ prediction macro to model a leakage current prediction for said circuit design, said leakage current prediction determinable at a device, cell, circuit, or IC chip level of said design,
    automatically calculating one or more uplift factors representing device variation effects for use in said leakage current prediction model according to the switch value, an uplift factor being a function of a statistical quantity $\sigma_{lpoly}$ of the polysilicon gate length variation of a transistor, a statistical quantity $\sigma_{vtsat}$ of the transistor saturation threshold voltage variation, and a statistical quantity $\sigma_{subx}$ of the transistor sub-threshold slope,
    wherein for a specified uplift factor switch value, $\sigma_{lpoly}=\sigma_{ACLV}$; $\sigma_{vtsat}$ is calculated as a function of a statistical quantity $\sigma_{VthRDF}$ defining a 1-sigma Random-Dopant-Fluctuation Induced Vth Variation, and $\sigma_{subx}$ is calculated as a function of a statistical quantity $\sigma_{subVth}$ defining a 1-sigma subVth Slope Variation, where Vth is the threshold voltage of the transistor device, and $\sigma_{ACLV}$ is a 1-sigma Across-Chip Lpoly Length Variation value due to within chip Across-Chip-Length-Variation,
    wherein a processor device performs at least one of said receiving, using, modeling and uplift factor calculating.

2. The method for simulating an integrated circuit (IC) design as claimed in claim 1, further including: when simulating, accessing a performance prediction macro to establish a performance model for said circuit design, wherein said accessing a performance prediction macro and IDDQ prediction macro are performed in parallel at said simulator.

3. The method for simulating an integrated circuit (IC) design as claimed in claim 1, wherein for another specified uplift factor switch value, $\sigma_{lpoly}=0$, $\sigma_{vtsat}=0$ and $\sigma_{subx}=0$.

4. The method for simulating an integrated circuit (IC) design as claimed in claim 1, wherein $$\sigma_{vtsat} = \sqrt{\frac{\sigma_{VthRDF}^2}{nf}}$$

and $$\sigma_{subx} = \sqrt{\frac{\sigma_{subVth}^2}{nf}},$$

where $\sigma_{VthRDF}$ is said 1-sigma Random-Dopant-Fluctuation Induced Vth Variation, $\sigma_{subVth}$ is said 1-sigma subVth Slope Variation, and where nf is a number of gate fingers of a transistor device being modeled.

5. The method for simulating an integrated circuit (IC) design as claimed in claim 1, wherein for a further specified uplift factor switch value, $\sigma_{lpoly}=0$; $\sigma_{vtsat}=\sigma_{VthRDF}$ and, $\sigma_{subx}=\sigma_{subVth}$.

6. The method for simulating an integrated circuit (IC) design as claimed in claim 1, wherein said 1-sigma Across-Chip Lpoly Length Variation is a statistical quantity of the within-chip distribution of transistor polysilicon gate length.

7. The method for simulating an IC design as claimed in claim 6, said method further comprising:
    calculating a nominal current between drain and source (Ids_nom) of said transistor device at different corners, but without accounting for any uplift factors, and,
    subsequently calculating a total current between drain and source of said transistor device as a function of said Ids_nom, and uplift factors, and a number of fingers (nf) of a gate of said transistor,
    said calculating including calculating a length variation uplift factor for said Across-Chip-Length-Variation (ACLV), said $\sigma_{lpoly}$ being defined as a 1-sigma Lpoly, Lpoly being a poly length, and a function of a slope parameter, said slope parameter being a function of said statistical quantity $\sigma_{lpoly}$, said Lpoly, a fitting parameter "η" used to setup the prediction macro, and said slope parameter being a function of a Leakage Drain-to-Source Current value Ioff with Vgs<=Vth where Vgs is the transistor gate source voltage and Vth is the transistor threshold voltage.

8. The method for simulating an IC design as claimed in claim 7, wherein said ACLV uplift factor defined as $$ACLV = \exp\left(\frac{\sigma_{lpoly}^2}{2slope^2}\right)$$

$$slope = \frac{\eta \cdot \sigma_{lpoly}}{\ln(10) \cdot [\log(Ioff(Lpoly - \eta \cdot \sigma_{lpoly})) - \log(Ioff(Lpoly))]}.$$

9. The method for simulating current an IC design as claimed in claim 7, further comprising calculating an RDF (Random Dopant Fluctuation) uplift factor, said RDF uplift factor defined as $$RDF = \exp\left(\frac{\sigma_{vtsat}^2}{2slope^2}\right)$$

$$slope = \frac{\eta \cdot \sigma_{vtsat}}{\ln(10) \cdot [\log(Ioff(Vtsat - \eta \cdot \sigma_{vtsat})) - \log(Ioff(Vtsat))]}$$

where $\sigma_{vtsat}$ is defined as a 1-sigma Vtsat variation where 1-sigma Vtsat variation is a statistical quantity of the transistor saturation threshold voltage variation, and "$\eta$" is a fitting parameter used to setup the model, and Ioff is a Leakage Drain-to-Source Current with Vgs<=Vth, where Vgs is an applied gate source voltage and Vth is a transistor device threshold voltage.

10. The method for simulating an IC design as claimed in claim 7, further comprising calculating an RSF (Random Slope Fluctuation) uplift factor, said RSF uplift factor defined as $$RSF = \exp\left(\frac{\sigma_{subx}^2}{2slope^2}\right)$$

$$slope = \frac{\eta \cdot \sigma_{subx}}{\ln(10) \cdot [\log(Ioff(subVth + \eta \cdot \sigma_{subx})) - \log(Ioff(subVth))]}$$

where $\sigma_{subx}$ is defined as a 1-sigma subVth Slope variation, and n is a fitting parameter, and Ioff is a Leakage Drain-to-Source Current with Vgs<=Vth, where Vgs is an applied gate source voltage and Vth is the transistor device threshold voltage, and subVth is a sub threshold voltage.

11. The method for simulating an IC design as claimed in claim 7, further comprising: calculating a nominal gate on current (Igdon_nom) of said transistor device, but without accounting for any uplift factors, and,
  for modeling leakage current, subsequently calculating an I(gate, drain) and I(gate, source) current of said transistor device as a function of nf, said Igdon_nom, and an uplift factor due to Acoss-Chip-Tox-Variation, said (ACOV) uplift factor defined as $$ACOV = \exp\left(\frac{\sigma_{tox}^2}{2slope^2}\right)$$

$$slope = \frac{\eta \cdot \sigma_{tox}}{\ln(10) \cdot [\log(Ig(Tox - \eta \cdot \sigma_{tox})) - \log(Ig(Tox))]}$$

where $\sigma_{tox}$ is defined as a 1-sigma Tox Thickness Variation where 1-sigma Tox Thickness Variation is a statistical quantity of a transistor dielectric-oxide-thickness variation, and "$\eta$" is a fitting parameter, and Ig is a Leakage Drain-to-Source Current with Vgs<=Vth, where Vgs is an applied gate source voltage and Vth is a transistor device threshold voltage, and Tox is an oxide thickness variation.

12. The method for simulating an IC design as claimed in claim 7, further comprising: calculating a nominal gate off current (Igdoff_nom) of said transistor device, but without accounting for any uplift factors, and,
  for modeling leakage current, subsequently calculating an I(gate, drain) and I(gate, source) current of said transistor device as a function of nf, said Igdoff_nom, and an uplift factor due to Across-Chip-Tox-Variation, said (ACOV) uplift factor defined as $$ACOV = \exp\left(\frac{\sigma_{tox}^2}{2slope^2}\right)$$

$$slope = \frac{\eta \cdot \sigma_{tox}}{\ln(10) \cdot [\log(Ig(Tox - \eta \cdot \sigma_{tox})) - \log(Ig(Tox))]}$$

where $\sigma_{tox}$ is defined as a 1-sigma Tox Thickness Variation where 1-sigma Tox Thickness Variation is a statistical quantity of a transistor dielectric-oxide-thickness variation, and "$\eta$" is a fitting parameter, and Ig is a Leakage Drain-to-Source Current with Vgs<=Vth, where Vgs is an applied gate source voltage and Vth is a transistor device threshold voltage, and Tox is an oxide thickness variation.

13. The method for simulating an IC design as claimed in claim 7, further comprising: calculating a nominal gate Igidl and Igisl current values (Igidl_nom) of said transistor device, but without accounting for any uplift factors, and,
  for modeling leakage current, subsequently calculating an I(drain, sub) and I(source, sub) GIDL current of said transistor device as a function of nf and said Igidl_nom value, where said GIDL current is a leakage current flowing through the drain and source to substrate of a transistor and Igidl and Igisl respectively represent the GIDL current flowing through the respective drain or source junction of a transistor.

14. A system for simulating current leakage of a semiconductor device design comprising:
  a memory;
  a hardware processor in communications with the memory, wherein the hardware processor is capable of performing a method comprising:
    receiving data representing a circuit design, said data configured for input to and processing by a circuit design simulator, said data specifying an uplift switch value for an integrated circuit quiescent current (IDDQ) prediction macro, said switch value corresponding to one of: said device, cell, circuit, or IC chip level of design being simulated;
    when simulating said circuit, using said IDDQ prediction macro to model a leakage current prediction for said circuit design, said leakage current prediction determinable at a device, cell, circuit, or IC chip level of said design,
    automatically calculating one or more uplift factors representing device variation effects for use in said leakage current prediction model according to the switch value, an uplift factor being a function of a statistical quantity $\sigma_{lpoly}$ of the polysilicon gate length variation of a transistor, a statistical quantity $\sigma_{vtsat}$ of the transistor saturation threshold voltage variation, and a statistical quantity $\sigma_{subx}$ of the transistor sub-threshold slope, wherein for a specified uplift factor switch value, $\sigma_{lpoly}=\sigma_{ACLV}$; $\sigma_{vtsat}$ is calculated as a function of a statistical quantity $\sigma_{VthRDF}$ defining a 1-sigma Random-Dopant-Fluctuation Induced Vth Variation, and $\sigma_{subx}$ is calculated as a function of a statistical quantity $\sigma_{subVth}$ defining a 1-sigma subVth Slope Variation, where Vth is the threshold voltage of the transistor device, and $\sigma_{ACLV}$ is a 1-sigma Across-Chip Lpoly Length Variation value due to within chip Across-Chip-Length-Variation.

15. The system for simulating current leakage of a semiconductor device as claimed in claim 14, wherein $$\sigma_{vtsat} = \sqrt{\frac{\sigma_{VthRDF}^2}{nf}}$$

and $$\sigma_{subx} = \sqrt{\frac{\sigma_{subVth}^2}{nf}},$$

where $\sigma_{VthRDF}$ is said 1-sigma Random-Dopant-Fluctuation Induced Vth Variation, $\alpha_{subVth}$ is said 1-sigma subVth Slope Variation, and where of is a number of gate fingers of a transistor device being modeled.

16. The system for simulating current leakage of a semiconductor device as claimed in claim 14, wherein said 1-sigma Across-Chip Lpoly Length Variation is a statistical quantity of the within-chip distribution of transistor polysilicon gate length.

17. The system for simulating current leakage of a semiconductor device as claimed in claim 16, said method further comprising:
calculating a nominal current between drain and source (Ids_nom) of said transistor device at different corners, but without accounting for any uplift factors, and,
subsequently calculating a total current between drain and source of said transistor device as a function of said Ids_nom, and uplift factors, and a number of fingers (nf) of a gate of said transistor,
said calculating including calculating a length variation uplift factor for said Across-Chip-Length-Variation (ACLV), said $\sigma_{lpoly}$ being defined as a 1-sigma Lpoly, Lpoly being a poly length, and a function of a slope parameter, said slope parameter being a function of said statistical quantity $\sigma_{lpoly}$, said Lpoly, a fitting parameter "η" used to setup the prediction macro, and said slope parameter being a function of a Leakage Drain-to-Source Current value Ioff with Vgs<=Vth where Vgs is the transistor gate source voltage and Vth is the transistor threshold voltage.

18. A computer program product for simulating current leakage of a semiconductor device design, the computer program product comprising:
a non-transitory storage medium readable by a processing circuit and storing instructions for execution by the processing circuit for performing a method comprising:
receiving data representing a circuit design, said data configured for input to and processing by a circuit design simulator, said data specifying an uplift switch value for an integrated circuit quiescent current (IDDQ) prediction macro, said switch value corresponding to one of: said device, cell, circuit, or IC chip level of design being simulated;
when simulating said circuit, using said IDDQ prediction macro to model a leakage current prediction for said circuit design, said leakage current prediction determinable at a device, cell, circuit, or IC chip level of said design,
automatically calculating one or more uplift factors representing device variation effects for use in said leakage current prediction model according to the switch value, an uplift factor being a function of a statistical quantity $\sigma_{lpoly}$ of the polysilicon gate length variation of a transistor device, a statistical quantity $\sigma_{vtsat}$ of the transistor saturation threshold voltage variation, and a statistical quantity $\sigma_{subx}$ of the transistor sub-threshold slope,
wherein for a specified uplift factor switch value, $\sigma_{lpoly}=\sigma_{ACLV}$; $\sigma_{vtsat}$ is calculated as a function of a statistical quantity $\sigma_{VthRDF}$ defining a 1-sigma Random-Dopant-Fluctuation Induced Vth Variation, and $\sigma_{subx}$ is calculated as a function of a statistical quantity $\sigma_{subVth}$ defining a 1-sigma subVth Slope Variation, where Vth is the threshold voltage of the transistor device, and $\sigma_{ACLV}$ is a 1-sigma Across-Chip Lpoly Length Variation value due to within chip Across-Chip-Length-Variation.

19. The computer program product as claimed in claim 18, wherein $$\sigma_{vtsat} = \sqrt{\frac{\sigma_{VthRDF}^2}{nf}}$$

and $$\sigma_{subx} = \sqrt{\frac{\sigma_{subVth}^2}{nf}},$$

and where $\sigma_{VthRDF}$ is said 1-sigma Random-Dopant-Fluctuation Induced Vth Variation, $\sigma_{subVth}$ is said 1-sigma subVth Slope Variation, and where nf is a number of gate fingers of a transistor device being modeled.

20. The computer program product as claimed in claim 18, said method further comprising:
calculating a nominal current between drain and source (Ids_nom) of said transistor device at different corners, but without accounting for any uplift factors, and,
subsequently calculating a total current between drain and source of said transistor device as a function of said Ids_nom, and uplift factors, and a number of fingers (nf) of a gate of said transistor,
said calculating including calculating a length variation uplift factor for said Across-Chip-Length-Variation (ACLV), said $\sigma_{lpoly}$ being defined as a 1-sigma Lpoly, Lpoly being a poly length, and a function of a slope parameter, said slope parameter being a function of said statistical quantity $\sigma_{lpoly}$, said Lpoly, a fitting parameter "η" used to setup the prediction macro, and said slope parameter being a function of a Leakage Drain-to-Source Current value Ioff with Vgs<=Vth where Vgs is the transistor gate source voltage and Vth is the transistor threshold voltage.

21. The computer program product for simulating an IC design as claimed in claim 20, wherein said ACLV uplift factor defined as $$ACLV = \exp\left(\frac{\sigma_{lpoly}^2}{2slope^2}\right)$$

-continued $$\text{slope} = \frac{\eta \cdot \sigma_{lpoly}}{\ln(10) \cdot [\log(Ioff(Lpoly - \eta \cdot \sigma_{lpoly})) - \log(Ioff(Lpoly))]}.$$

22. The computer program product as claimed in claim 20, said calculating comprising: calculating an RDF (Random Dopant Fluctuation) uplift factor, said RDF uplift factor defined as $$RDF = \exp\left(\frac{\sigma_{vtsat}^2}{2slope^2}\right)$$

$$\text{slope} = \frac{\eta \cdot \sigma_{vtsat}}{\ln(10) \cdot [\log(Ioff(Vtsat - \eta \cdot \sigma_{vtsat})) - \log(Ioff(Vtsat))]}$$

where $\sigma_{vtsat}$ is defined as a 1-sigma Vtsat variation where 1-sigma Vtsat variation is a statistical quantity of the transistor saturation threshold voltage variation, and "η" is a fitting parameter used to setup the model, and Ioff is a Leakage Drain-to-Source Current with Vgs<=Vth, where Vgs is an applied gate source voltage and Vth is a transistor device threshold voltage.

23. The computer program product as claimed in claim 20, said calculating comprising: calculating an RSF (Random Slope Fluctuation) uplift factor, said RSF uplift factor defined as $$RSF = \exp\left(\frac{\sigma_{subx}^2}{2slope^2}\right)$$

$$\text{slope} = \frac{\eta \cdot \sigma_{subx}}{\ln(10) \cdot [\log(Ioff(subVth + \eta \cdot \sigma_{subx})) - \log(Ioff(subVth))]}$$

where $\sigma_{subx}$ is defined as a 1-sigma subVth Slope variation, and n is a fitting parameter, and Ioff is a Leakage Drain-to-Source Current with Vgs<=Vth, where Vgs is an applied gate source voltage and Vth is the transistor device threshold voltage, and subVth is a sub threshold voltage.

24. The computer program product as claimed in claim 20, said calculating comprising: calculating a nominal gate on current (Igdon_nom) of said transistor device, but without accounting for any uplift factors, and, for modeling leakage current, subsequently calculating an I(gate, drain) and I(gate, source) current of said transistor device as a function of nf, said Igdon_nom, and an uplift factor due to Acoss-Chip-Tox-Variation, said (ACOV) uplift factor defined as $$ACOV = \exp\left(\frac{\sigma_{tox}^2}{2slope^2}\right)$$

$$\text{slope} = \frac{\eta \cdot \sigma_{tox}}{\ln(10) \cdot [\log(Ig(Tox - \eta \cdot \sigma_{tox})) - \log(Ig(Tox))]}$$

where $\sigma_{tox}$ is defined as a 1-sigma Tox Thickness Variation where 1-sigma Tox Thickness Variation is a statistical quantity of a transistor dielectric-oxide-thickness variation, and "η" is a fitting parameter, and Ig is a Leakage Drain-to-Source Current with Vgs<=Vth, where Vgs is an applied gate source voltage and Vth is a transistor device threshold voltage, and Tox is an oxide thickness variation.

25. The computer program product as claimed in claim 20, said calculating further comprising: calculating a nominal gate off current (Igdoff_nom) of said transistor device, but without accounting for any uplift factors, and, for modeling leakage current, subsequently calculating an I(gate, drain) and I(gate, source) current of said transistor device as a function of nf, said Igdoff_nom, and an uplift factor due to Across-Chip-Tox-Variation, said (ACOV) uplift factor defined as $$ACOV = \exp\left(\frac{\sigma_{tox}^2}{2slope^2}\right)$$

$$\text{slope} = \frac{\eta \cdot \sigma_{tox}}{\ln(10) \cdot [\log(Ig(Tox - \eta \cdot \sigma_{tox})) - \log(Ig(Tox))]}$$

where $\sigma_{tox}$ is defined as a 1-sigma Tox Thickness Variation where 1-sigma Tox Thickness Variation is a statistical quantity of a transistor dielectric-oxide-thickness variation, and "η" is a fitting parameter, and Ig is a Leakage Drain-to-Source Current with Vgs<=Vth, where Vgs is an applied gate source voltage and Vth is a transistor device threshold voltage, and Tox is an oxide thickness variation.

26. The computer program product as claimed in claim 20, said calculating further comprising: calculating a nominal gate Igidl and Igisl current values (Igidl_nom) of said transistor device, but without accounting for any uplift factors, and, for modeling leakage current, subsequently calculating an I(drain, sub) and I(source, sub) GIDL current of said transistor device as a function of nf and said Igidl_nom value, where said GIDL current is a leakage current flowing through the drain and source to substrate of a transistor and Igidl and Igisl respectively represent the GIDL current flowing through the respective drain or source junction of a transistor.

* * * * *